(12) United States Patent
Iseki et al.

(10) Patent No.: US 10,901,320 B2
(45) Date of Patent: Jan. 26, 2021

(54) DEVELOPING METHOD, DEVELOPING APPARATUS, AND COMPUTER-READABLE RECORDING MEDIUM

(71) Applicant: TOKYO ELECTRON LIMITED, Tokyo (JP)

(72) Inventors: Tomohiro Iseki, Koshi (JP); Hirofumi Takeguchi, Koshi (JP); Yuichi Terashita, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 64 days.

(21) Appl. No.: 16/124,328

(22) Filed: Sep. 7, 2018

(65) Prior Publication Data
US 2019/0056666 A1 Feb. 21, 2019

Related U.S. Application Data

(62) Division of application No. 14/802,810, filed on Jul. 17, 2015, now Pat. No. 10,120,286.

(30) Foreign Application Priority Data

Jul. 25, 2014 (JP) .................................. 2014-152123

(51) Int. Cl.
G03F 7/32 (2006.01)
G03F 7/30 (2006.01)
(Continued)

(52) U.S. Cl.
CPC .............. *G03F 7/32* (2013.01); *G03F 7/3021* (2013.01); *B05D 1/005* (2013.01); *G06F 19/00* (2013.01); *H01L 21/6715* (2013.01)

(58) Field of Classification Search
CPC ......... B05D 1/005; G03F 7/3021; G03F 7/32; H01L 21/6715
(Continued)

(56) References Cited

U.S. PATENT DOCUMENTS 5,788,773 A * 8/1998 Okuda .................... B05C 11/08
118/319
5,965,200 A 10/1999 Tateyama et al.
(Continued)

FOREIGN PATENT DOCUMENTS

JP 4-217257 A 8/1992
JP 2000-173906 A 6/2000
(Continued)

*Primary Examiner* — Kirsten Jolley
(74) *Attorney, Agent, or Firm* — Nath, Goldberg & Meyer; Jerald L. Meyer

(57) ABSTRACT

There is provided a method of developing an exposed resist film formed on a surface of a substrate to form a resist pattern, which includes: rotating the substrate about a rotation axis that extends in a direction perpendicular to the surface of the substrate that is horizontally supported; supplying a developing solution through a discharge hole positioned above the substrate onto the resist film such that the developing solution is widely spread on a surface of the resist film; and positioning a wetted part having a surface that faces the surface of the substrate, above a preceding region in the surface of the substrate, the preceding region being a region to which the developing solution is preferentially supplied through the discharge hole.

5 Claims, 19 Drawing Sheets

(51) Int. Cl.
*H01L 21/67* (2006.01)
*B05D 1/00* (2006.01)
*G06F 19/00* (2018.01)

(58) Field of Classification Search
USPC ........................................................ 427/240
See application file for complete search history.

(56) References Cited

U.S. PATENT DOCUMENTS

| | | | | |
|---|---|---|---|---|
| 6,265,323 | B1* | 7/2001 | Nakamura | G03F 7/3021 |
| | | | | 438/745 |
| 6,550,990 | B2* | 4/2003 | Sakurai | G03D 5/003 |
| | | | | 118/52 |
| 7,387,455 | B2 | 6/2008 | Awamura et al. | |
| 2001/0003965 | A1* | 6/2001 | Sada | H01L 21/6715 |
| | | | | 118/63 |
| 2001/0003966 | A1* | 6/2001 | Kitano | H01L 21/6715 |
| | | | | 118/70 |
| 2002/0046703 | A1 | 4/2002 | Templeton | |
| 2004/0163670 | A1* | 8/2004 | Ko | G01N 1/02 |
| | | | | 134/2 |
| 2009/0073394 | A1* | 3/2009 | Miyagi | H01L 21/67051 |
| | | | | 355/27 |
| 2012/0189773 | A1* | 7/2012 | Tachibana | B05D 1/005 |
| | | | | 427/240 |
| 2015/0036110 | A1 | 2/2015 | Yoshihara et al. | |

FOREIGN PATENT DOCUMENTS

| | | |
|---|---|---|
| JP | 2001-196301 A | 7/2001 |
| JP | 2006-66799 A | 3/2006 |
| JP | 2011-091274 A | 5/2011 |
| JP | 2012-074589 A | 4/2012 |
| KR | 10-0267618 B1 | 10/2000 |

* cited by examiner

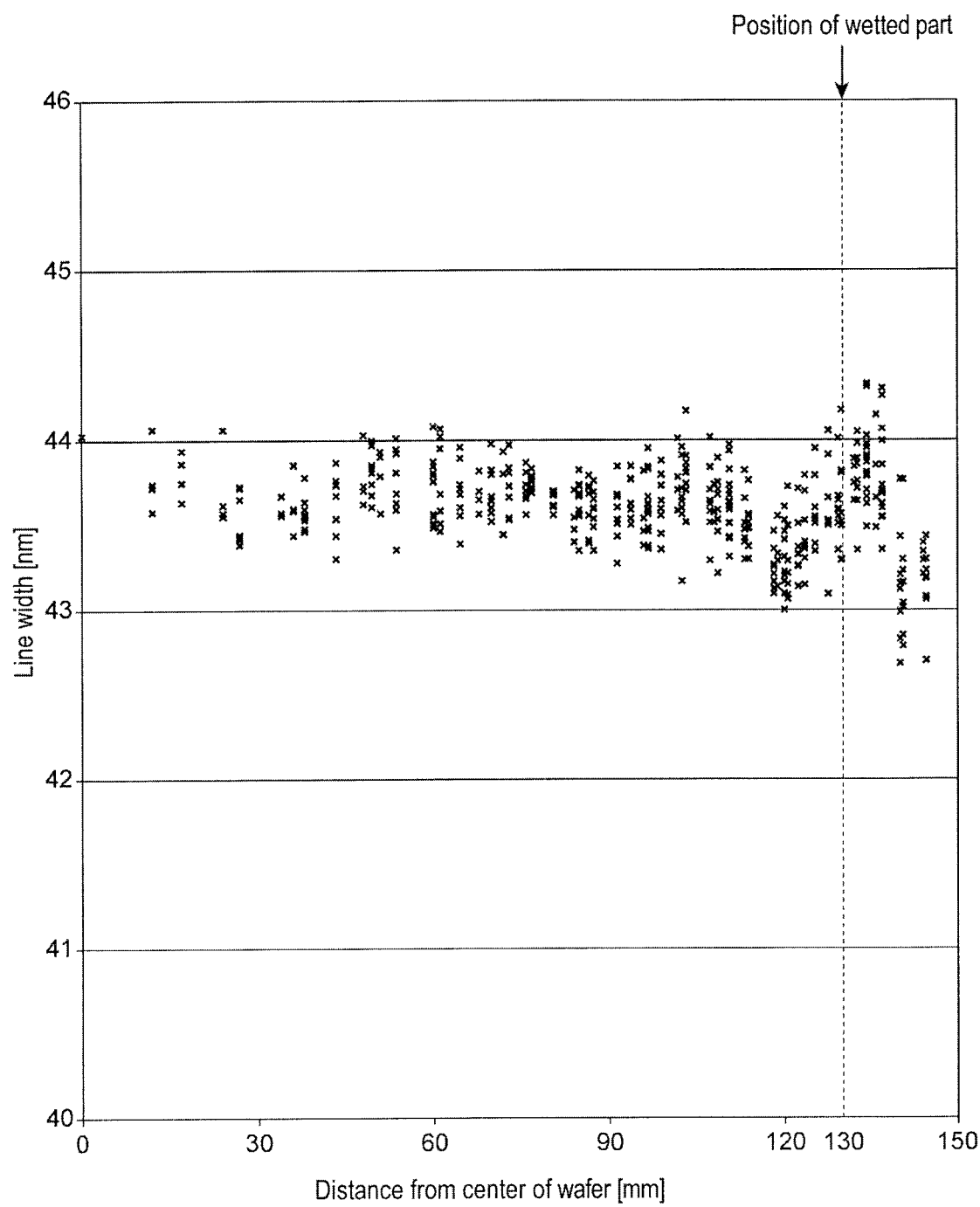

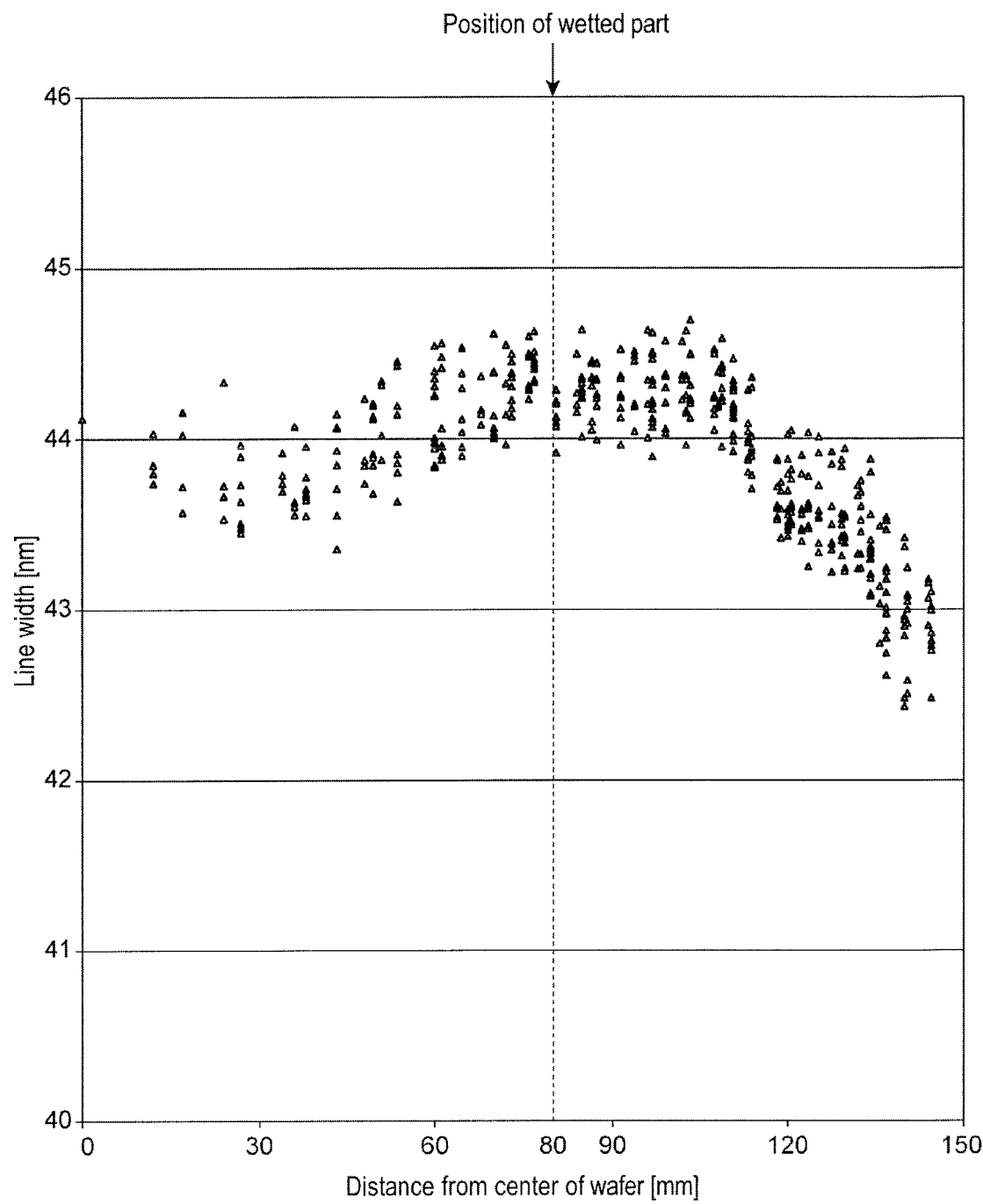

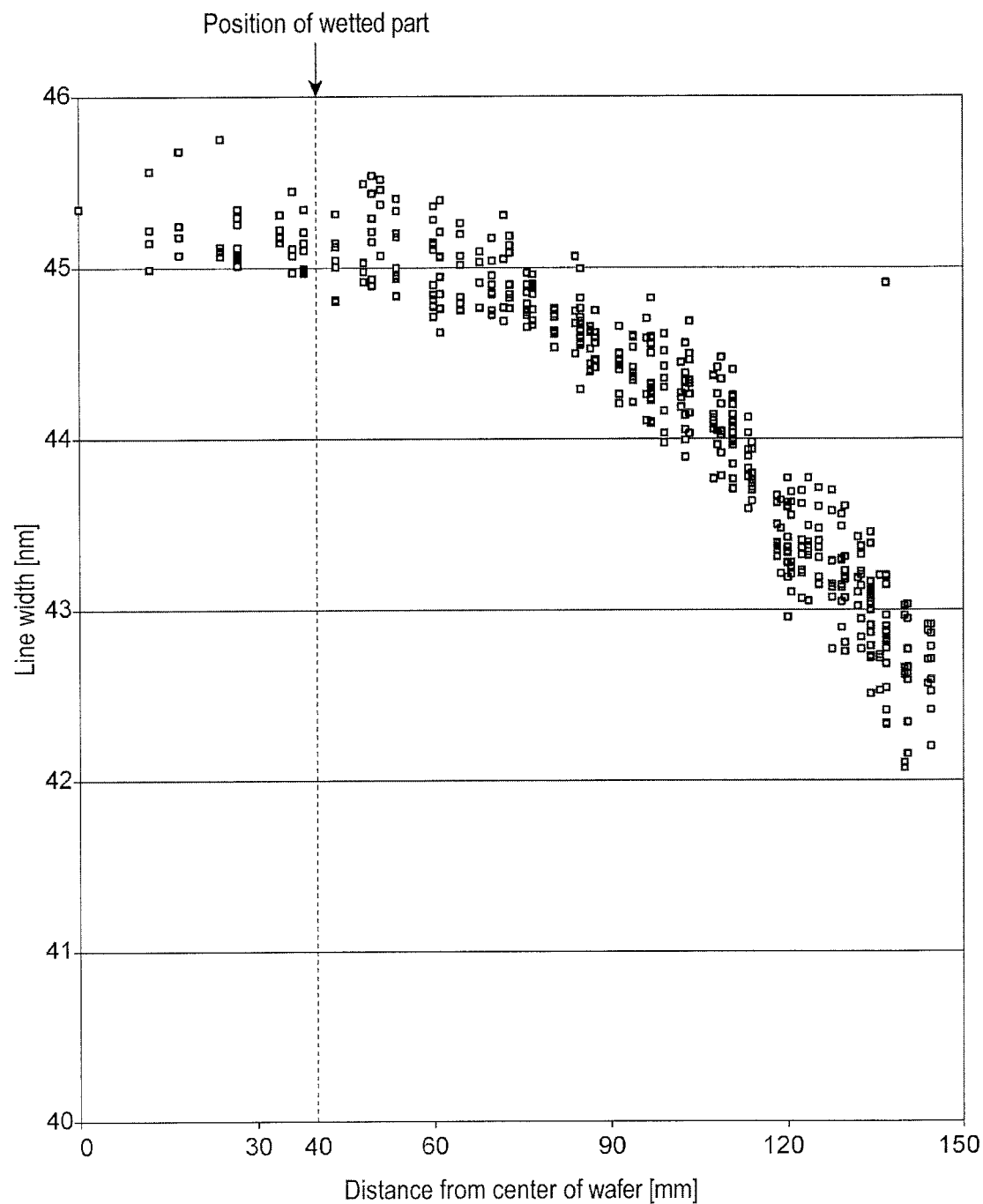

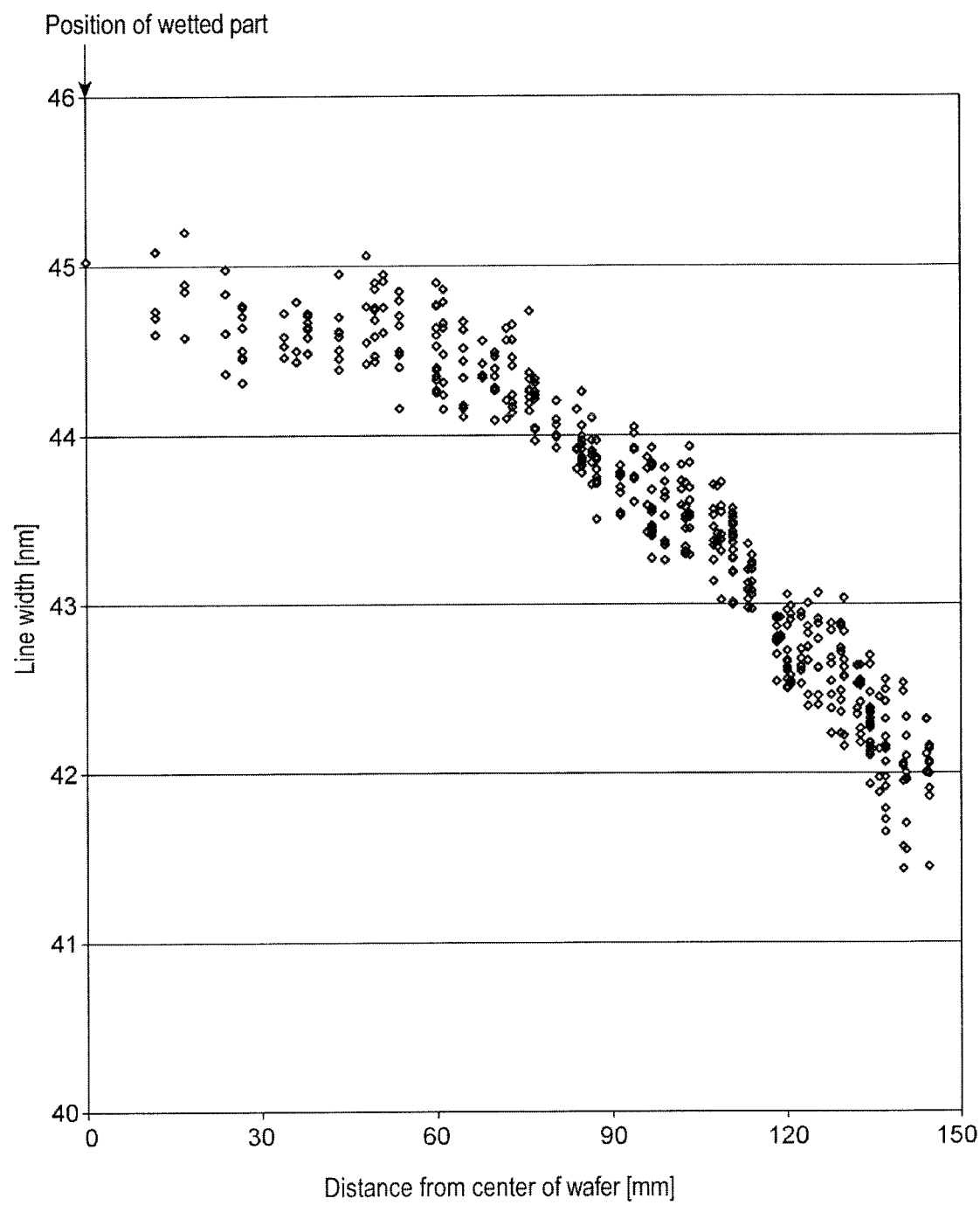

DEVELOPING METHOD, DEVELOPING APPARATUS, AND COMPUTER-READABLE RECORDING MEDIUM

CROSS-REFERENCE TO RELATED APPLICATION

This is a Divisional Application of the U.S. patent application Ser. No. 14/802,810, filed Jul. 17, 2015, an application claiming benefit of Japanese Patent Application No. 2014-152123, filed on Jul. 25, 2014, in the Japan Patent Office, the disclosures of which are incorporated herein in their entireties by reference.

TECHNICAL FIELD

The present disclosure relates to a method and an apparatus which develop a resist film after exposure, and a computer-readable recording medium used in the developing apparatus.

BACKGROUND

Recently, in performing a fine processing on a substrate, a process of forming an irregular pattern on the substrate (for example, a semiconductor wafer) using a photolithography technique has been extensively used. As an example, a process of forming a resist pattern on the semiconductor wafer includes forming a resist film on a surface of the semiconductor wafer, exposing the resist film with a predetermined pattern, and reacting a developing solution with the exposed resist film for development.

Various developing techniques have so far been developed. As an example, there is a developing scheme in which a paddle (liquid collected portion) formed of a developing solution is formed on a stationary substrate. A nozzle having a long discharge hole is used in forming the paddle. The nozzle is moved from one end of the substrate to the other end thereof while discharging the developing solution through the discharge hole such that the developing solution is applied on the entire surface of the resist film formed on the substrate. This developing scheme will be referred to as a "stationary developing scheme" for the sake of simplicity.

Further, there is a developing scheme of supplying a developing solution onto a rotating substrate. A nozzle supplies a developing solution onto the substrate through a discharge hole while moving in a radial direction of the substrate. A liquid film of the developing solution is formed on the resist film by virtue of an action of a centrifugal force generated by the rotation of the substrate and a movement of a position to which the developing solution is supplied. Hereinafter, for the sake of simplicity, the developing scheme of supplying the developing solution onto the rotating substrate will be referred to as a "rotational developing scheme".

In addition, there is a developing method classified as the rotational developing scheme. Specifically, in this method, a nozzle having a bottom surface disposed to face a wafer is used. In a state where a gap between the wafer being in rotation and the bottom surface of the nozzle disposed in a region including a rotational center of the wafer is liquid-tightly maintained, a liquid is supplied onto the wafer and spread outwardly by virtue of a centrifugal force.

The stationary developing scheme fails to occur through convection of the developing solution in the paddle formed of the developing solution so that the developing solution having a degraded reactivity with respect to the resist film tends to be held in-situ. This requires a relatively long period of time for a development process.

In the rotational developing scheme, the developing solution supplied onto the substrate flows on the substrate. In this case, since the developing solution flows on the substrate, the developing solution, while flowing, reacts with the resist film. Thus, a concentration of the developing solution is changed along a direction in which the developing solution flows. The change of the concentration us, due to the flow of the developing solution, a distribution (which is also called an "in-plane line width distribution") of line width of the resist pattern (which is also called a critical dimension (CD), and hereinafter, a line width of the resist pattern will be simply referred to as a "line width") in a surface of the substrate may become uneven.

SUMMARY

Some embodiments of the present disclosure provide a developing method and a developing apparatus which are capable of enhancing uniformity of an in-plane line width distribution, and a computer-readable recording medium.

According to one embodiment of the present disclosure, there is provided a method of developing an exposed resist film formed on a surface of a substrate to form a resist pattern, which includes: rotating the substrate about a rotation axis that extends in a direction perpendicular to the surface of the substrate that is horizontally supported; supplying a developing solution through a discharge hole positioned above the substrate onto the resist film such that the developing solution is widely spread on a surface of the resist film; and positioning a wetted part having a surface that faces the surface of the substrate, above a preceding region in the surface of the substrate, the preceding region being a region to which the developing solution is preferentially supplied through the discharge hole.

According to another embodiment of the present disclosure, there is provided an apparatus of developing an exposed resist film formed on a surface of a substrate to form a resist pattern, which includes: a rotating/holding part configured to rotate the substrate about a rotation axis that extends in a direction perpendicular to the surface of the substrate, while supporting the substrate horizontally; a discharge hole through which a developing solution is supplied onto the resist film; a wetted part having a surface that faces the surface of the substrate; a moving mechanism configured to move the wetted part; and a control part configured to control the moving mechanism to position the wetted part above a predetermined region in which a line width of the resist pattern needs to be adjusted, in the surface of the substrate, while the developing solution is supplied onto the resist film.

According to another embodiment of the present disclosure, there is provided a non-transitory computer-readable recording medium storing a program for executing the aforementioned method in a developing apparatus.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 16 is a graph showing relationships between distances from the center of a wafer and line widths of a resist pattern, in experimental example 1.

FIG. 17 is a graph showing relationships between distances from the center of a wafer and line widths of a resist pattern, in experimental example 2.

FIG. 18 is a graph showing relationships between distances from the center of a wafer and line widths of a resist pattern, in experimental example 3.

FIG. 19 is a graph showing relationships between distances from the center of a wafer and line widths of a resist pattern, in experimental example 4.

DETAILED DESCRIPTION

Figure 1:
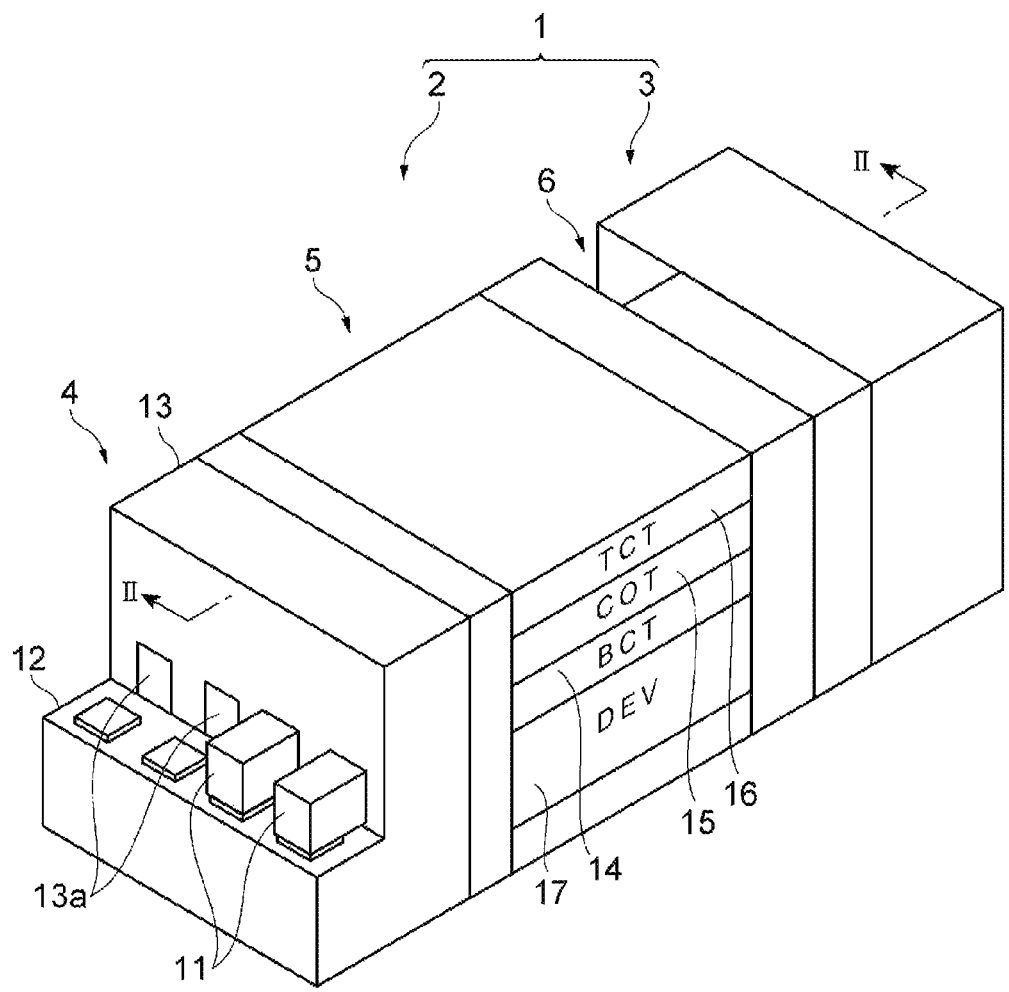
FIG. 1 is a perspective view showing a substrate processing system.

Reference will now be made in detail to various embodiments, examples of which are shown in the accompanying drawings. In the following detailed description, numerous specific details are set forth in order to provide a thorough understanding of the present disclosure. However, it will be apparent to one of ordinary skill in the art that the present disclosure may be practiced without these specific details. In the following description, the same reference numerals are used for the same components or components having the same functions, and a repeated description thereof will be omitted. In other instances, well-known methods, procedures, systems, and components have not been described in detail so as not to unnecessarily obscure aspects of the various embodiments.

[Configuration of Substrate Processing System]

A substrate processing system 1 includes a coating/developing apparatus 2 and an exposure apparatus 3. The exposure apparatus 3 performs an exposure process on a resist film. Specifically, the exposure apparatus 3 irradiates an energy ray to an exposure target portion of the resist film (photoresist film) using a liquid immersion lithography or the like. Examples of the energy ray may include an ArF excimer laser, a KrF excimer laser, a g-ray, an i-ray, or an extreme ultraviolet (EUV) ray.

The coating/developing apparatus 2 forms a resist film on a surface of a wafer W (substrate) before the exposure process, and performs a development process on the resist film which has been subjected to the exposure process. In this embodiment, the wafer W has a disk shape. In some embodiments, the wafer may have a shape where a portion of a circular shape is cut out, or a shape other than the circular shape, such as a polygonal shape. An example of the wafer W may include various substrates such as a semiconductor substrate, a glass substrate, a mask substrate, a flat panel display (FPD) substrate, or the like.

Figure 2:
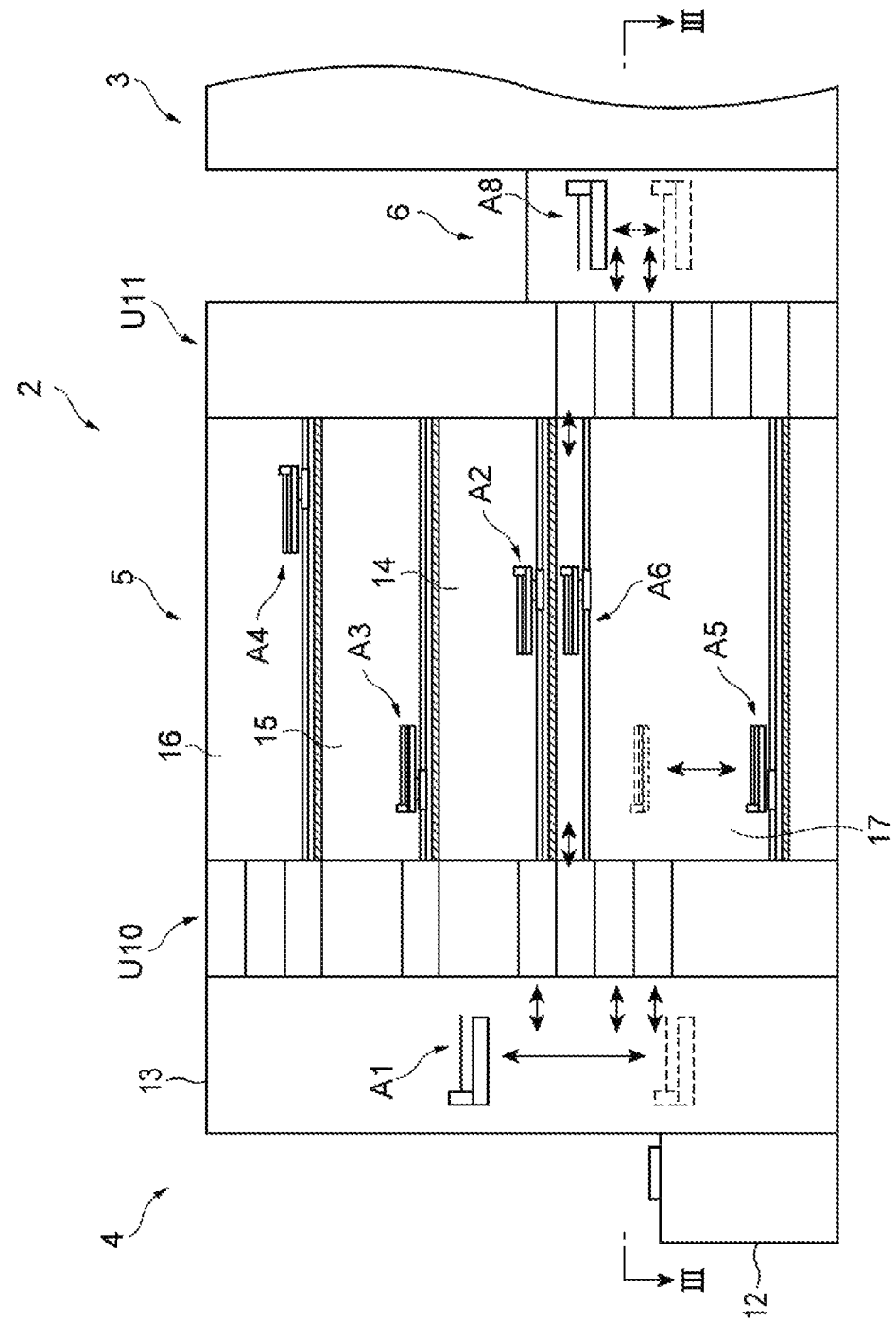
FIG. 2 is a cross-sectional view taken along line II-II of FIG. 1.
Figure 3:
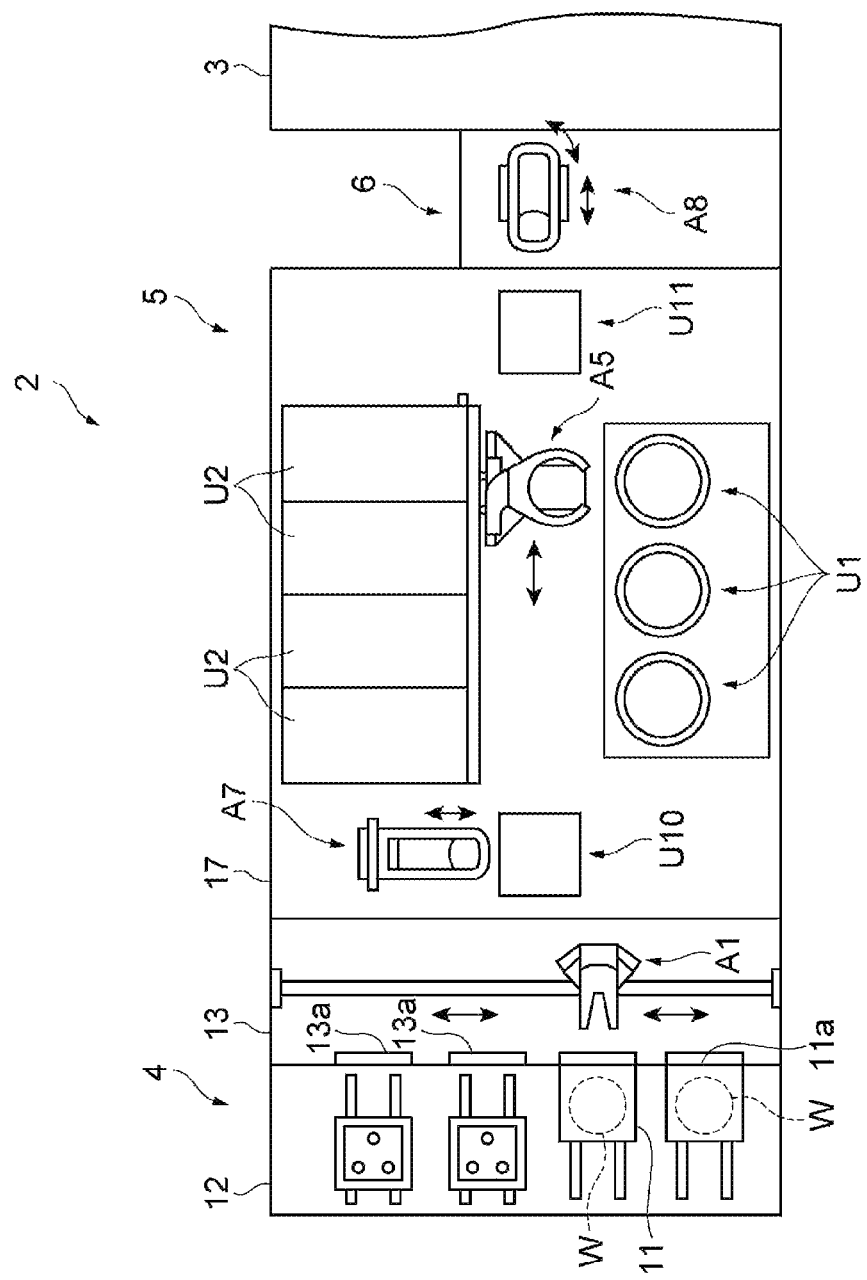
FIG. 3 is a cross-sectional view taken along line of FIG. 2.

As shown in FIGS. 1 to 3, the coating/developing apparatus 2 includes a carrier block 4, a processing block 5, and an interface block 6. The carrier block 4, the processing block 5, and the interface block 6 are horizontally arranged in a line.

The carrier block 4 includes a carrier station 12 and a loading/unloading part 13. The loading/unloading part 13 is disposed between the carrier station 12 and the processing block 5. The carrier station 12 supports a plurality of carriers 11. Each of the carriers 11 accommodates, for example, a plurality of circular wafers W in a sealed state. An opening/closing door (not shown) through which the wafer W is transferred, is installed in a side surface 11a of each of the carriers 11 (see FIG. 3). Each of the carriers 11 is detachably installed on the carrier station 12 such that the side surface 11a thereof faces the loading/unloading part 13. The loading/unloading part 13 includes a plurality of opening/closing doors 13a corresponding respectively to the carriers 11 disposed on the carrier station 12. By opening the opening/closing doors installed in the side surface 11a, the opening/closing doors 13a are simultaneously opened such that the interior of the carriers 11 and the interior of the loading/unloading part 13 communicate with each other. The loading/unloading part 13 includes a transfer arm A1. The transfer arm A1 picks up the wafer W from the carrier 11 and transfers the same to the processing block 5, and subsequently, receives the processed wafer W from the processing block 5 and returns the same to the carrier 11.

The processing block 5 includes a BCT module (bottom layer film forming module) 14, a COT (resist film forming module) 15, and a TCT module (top layer film forming module) 16, and a DEV module (development process module) 17. These modules are arranged in order of the DEV module 17, the BCT module 14, the COT module 15, and the TCT module 16 from the bottom.

The BCT module 14 is configured to form a bottom layer film on the surface of the wafer W. The BCT module 14 includes a plurality of coating units (not shown), a plurality of heat treating units (not shown), and a transfer arm A2 configured to transfer the wafer W between these units. Each of the coating units is configured to apply a coating solution for forming the bottom layer film onto the surface of the wafer W. Each of the heat treating units is configured to perform a heat treatment in which the wafer W is heated using, e.g., a heating plate, and the heated wafer W is cooled down using, e.g., a cooling plate. A specific example of the heat treatment performed by the BCT module 14 may be a heat treatment to cure the bottom layer film.

The COT module 15 is configured to form a resist film having a thermosetting property and photosensitivity on the bottom layer film. The COT module 15 includes a plurality of coating units (not shown), a plurality of heat treating units (not shown), and a transfer arm A3 configured to transfer the wafer W between these units. Each of the coating units is configured to apply a processing solution (resist agent) for forming the resist film onto the bottom layer film. Each of the heat treating units is configured to perform a heat treatment in which the wafer W is heated using, e.g., a heating plate, and the heated water W is cooled down using, e.g., a cooling plate. A specific example of the heat treatment performed by the COT module 15 may be a heat treatment (pre-applied bake (PAB)) to cure the resist film.

The TCT module 16 is configured to form a top layer film on the resist film. The TCT module 16 includes a plurality of coating units (not shown), a plurality of heat treating units (not shown), and a transfer arm A4 configured to transfer the wafer W between these units. Each of the coating units is configured to apply a coating solution for forming the top layer film onto the surface of the wafer W. Each of the heat treating units is configured to perform a heat treatment in which the wafer W is heated using, e.g., a heating plate, and the heated wafer W is cooled down using, e.g., a cooling plate. A specific example of the heat treatment performed by the TCT module 16 may be a heat treatment to cure the top layer film.

The DEV module 17 is configured to perform a development process on the resist film after the exposure. The DEV module 17 includes a plurality of developing units (developing devices) U1, a plurality of heat treating units U2, a transfer arm A5 configured to transfer the wafer W between these units, and a direct transfer arm A6 configured to directly transfer the wafer W without passing through these units (see FIGS. 2 and 3). Each of the developing units U1 is configured to partially remove the resist film to form a resist pattern. Each of the heat treating units U2 is configured to perform a heat treatment in which the wafer W is heated using, e.g., a heating plate, and the heated water W is cooled down using, e.g., a cooling plate. A specific example of the heat treatment performed by the DEV module 17 may be a heat treatment (post-exposure bake (PEB)) before the development process, another heat treatment (post bake (PB)) after the development process, or the like.

A shelf unit U10 is installed to be adjacent to the carrier block 4 within the processing block 5 (see FIGS. 2 and 3). The shelf unit U10 is installed to extend from the bottom surface up to the TCT module 16 and is divided into a plurality of cells arranged in a vertical direction. A lifting arm A7 is installed in the vicinity of the shelf unit U10. The lifting arm A7 is configured to lift up and down the wafer W between the cells of the shelf unit U10.

A shelf unit U11 is installed to be adjacent to the interface block 6 within the processing block 5 (see FIGS. 2 and 3). The shelf unit U11 is installed to extend from the bottom surface up to an upper portion of the DEV module 17, and is divided into a plurality of cells arranged in a vertical direction.

The interface block 6 includes a transfer arm A8 and is connected to the exposure apparatus 3. The transfer arm A8 is configured to extract the wafer W from the shelf unit U11 and transfer the same to the exposure apparatus 3, and receive the wafer W from the exposure apparatus 3 and return the same to the shelf unit U11.

[Configuration of Developing Unit]

Figure 4:
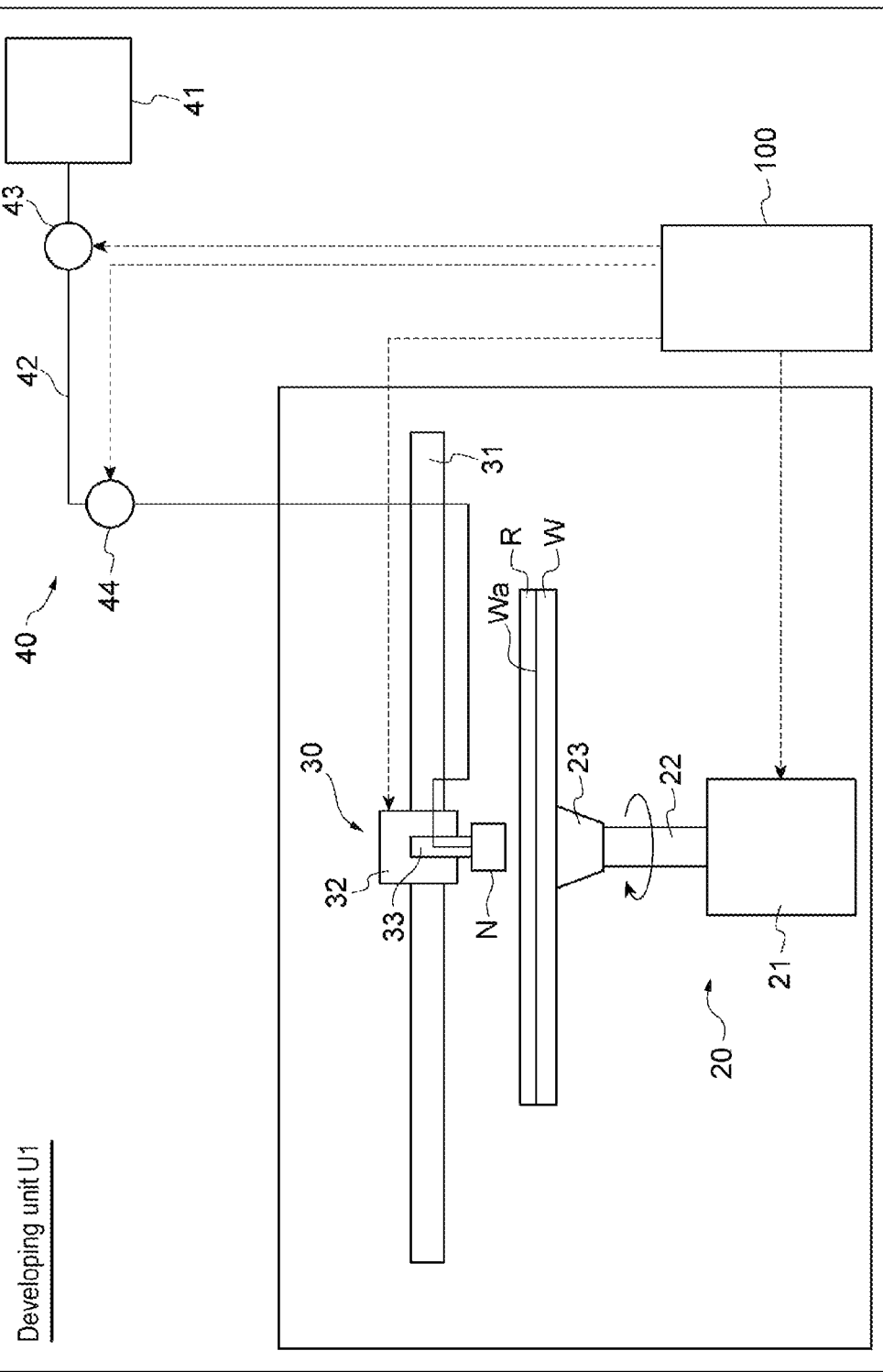
FIG. 4 is a schematic view showing a developing unit.
Figure 5:
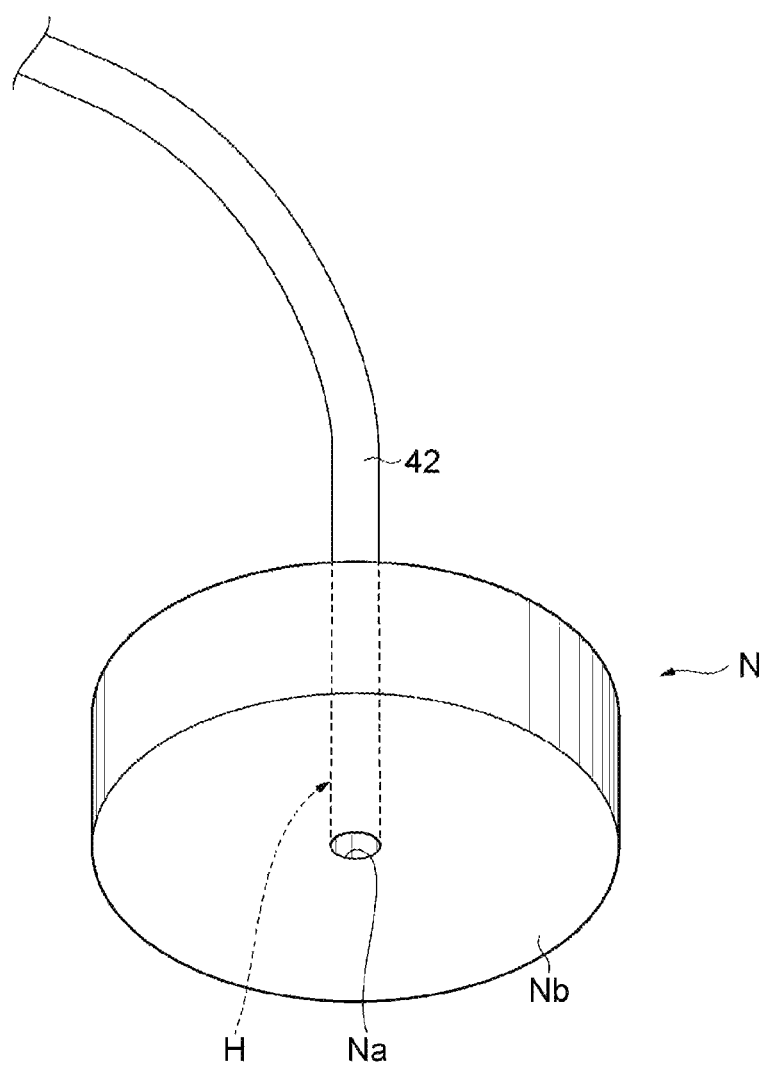
FIG. 5 is a perspective view of a wetted part when obliquely viewed from below.
Figure 6:
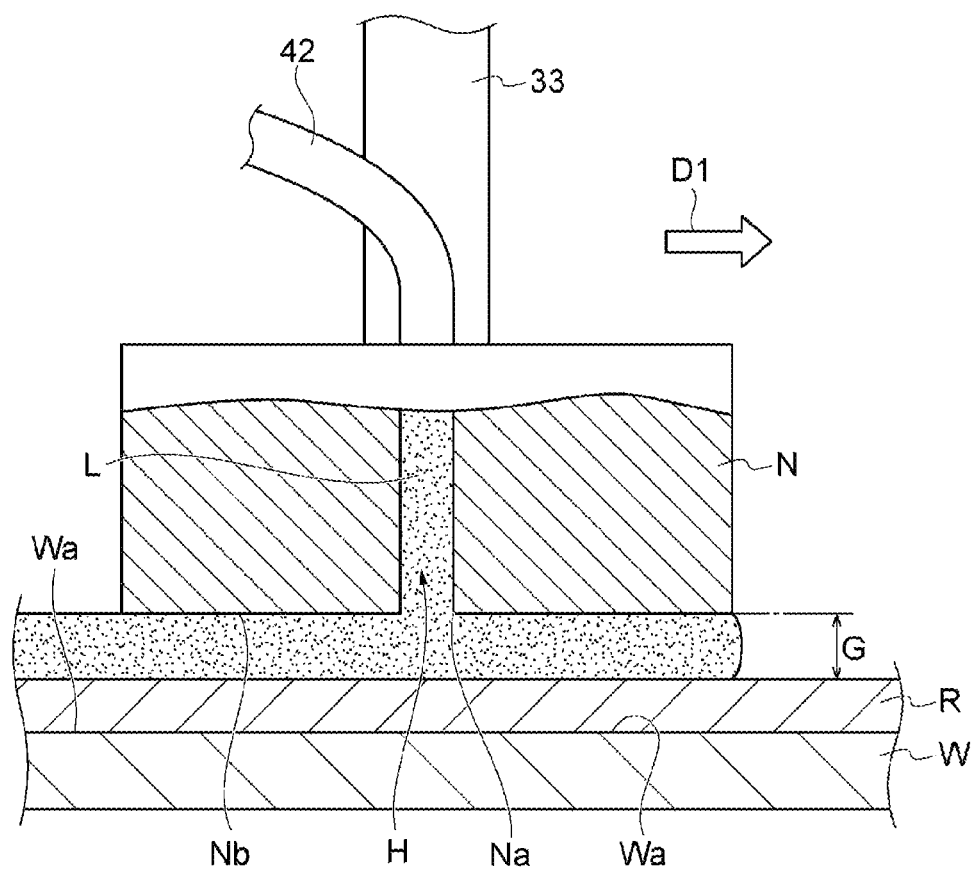
FIG. 6 is a cross-sectional view showing a state where a developing solution is supplied onto a resist film by the wetted part.

Hereinafter, the developing unit (developing device) U1 will be described in more detail with reference to FIGS. 4 to 6. As shown in FIG. 4, the developing unit U1 includes a rotating/holding part 20, a driving part (moving mechanism) 30, a developing solution supply part 40, and a control part 100.

The rotating/holding part 20 is provided with a rotating part 21 and a holding part 23. The rotating part 21 includes an upwardly-protruded shaft 22. The rotating part 21 rotates the shaft 22 using, for example, an electric motor as a power source. The holding part 23 is installed in a front end portion of the shaft 22. The wafer W with an exposed resist film R formed on a surface Wa thereof is horizontally mounted on the holding part 23. The holding part 23 holds the wafer W in a substantially horizontal state by virtue of, e.g., adsorption. That is to say, the rotating/holding part 20 rotates the wafer W about an axis (rotation axis) perpendicular to the surface Wa of the wafer W, while substantially horizontally holding the wafer W. In this embodiment, since the rotation axis passes through the center of the wafer W having a circular shape, the rotation axis is also the central axis. In this embodiment, as shown in FIG. 4, the rotating/holding part 20 rotates the wafer W in a clockwise direction when viewed from the top.

The driving part 30 is configured to drive a wetted part N. The driving part 30 includes a guide rail 31, a slide block 32, and an arm 33. The guide rail 31 is installed to be extended along a horizontal direction above the rotating/holding part 20 (in other words, the wafer W). The slide block 32 is connected to the guide rail 31 such that the slide block 32 is movable along the guide rail 31 in the horizontal direction. The arm 33 is connected to the slide block 32 such that the arm 33 is movable in a vertical direction. The wetted part N is connected to a lower end of the arm 33.

The driving part 30 moves the slide block 32 and the arm 33 using, for example, an electric motor as a power source, thus moving the wetted part N. When viewed from the top, the wetted part N moves along a straight line perpendicular to the rotation axis of the wafer W, in a diameter direction of the wafer W, while discharging the developing solution.

The developing solution supply part 40 includes a developing solution storage part 41, the wetted part N, a supply pipe 42, a pump 43, and a valve 44. The developing solution storage part 41 stores a developing solution L (see FIG. 6). Examples of the developing solution L stored in the developing solution storage part 41 may include a developing solution for positive photoresist or a developing solution for negative photoresist. In some embodiments, such developing solutions may be properly selected depending on a type of the resist film R. For example, an alkali aqueous solution may be used as the developing solution for a positive photoresist. A component of the alkali may be, for example, tetra methyl ammonium hydroxide (TMAH). For example, an organic solvent may be used as the developing solution for a negative photoresist.

The wetted part N is coupled to the developing solution storage part 41 through the supply pipe 42. As shown in FIG. 4, the wetted part N is disposed above the wafer W held by the holding part 23. As shown in FIG. 5, the wetted part N has a cylindrical shape or a disk shape in this embodiment. In the wetted part N, a through hole H penetrating through a central axis thereof is formed. One end of the through hole H is connected to the supply pipe 42. The other end of the through hole H is defined as a discharge hole Na from which the developing solution L supplied from the developing solution storage part 41 through the supply pipe 42 is discharged. Thus, the wetted part N also serves as a discharge nozzle of the developing solution L.

The wetted part N has a bottom surface (or facing surface) Nb formed to radially widen from the discharge hole Na. That is to say, the discharge hole Na is formed in the bottom surface Nb. In this embodiment, the bottom surface Nb is a substantially flat surface of a circular shape and faces the surface Wa of the wafer W in a substantially parallel relationship. Thus, the discharge hole Na is oriented vertically downward. With this configuration, the developing solution L is discharged downward from the discharge hole Na toward the surface Wa.

A cross-sectional shape of the discharge hole Na may be, for example, a circular shape. A diameter of the discharge hole Na may range from about 1 to 8 mm, and in some embodiments, may range from about 3 to 5 mm. A diameter of the bottom surface Nb may range from about 20 to 200 mm, and in some embodiments, may range from about 30 to 100 mm.

The pump 43 is installed in the middle of the supply pipe 42 and forcibly feeds the developing solution L from the developing solution storage part 41 to the wetted part N. The valve 44 is installed between the wetted part N and the pump 43 in the supply pipe 42. The valve 44 serves to start or stop the discharge of the developing solution L from the wetted part N.

The control part 100 is configured by one or more control computers, and controls the developing unit U1. The control part 100 has a display part (not shown) for displaying a setting screen of control conditions, an input part (not shown) for inputting the control conditions, and a reading part (not shown) for reading a program from a computer-readable recording medium. The recording medium stores a program to cause the developing unit U1 to perform the development process. This program is read by the reading part of the control part 100. Examples of the recording medium may include a semiconductor memory, an optical recording disk, a magnetic recording disk, or an optical magnetic recording disk. Based on the control conditions inputted to the input part and the program read by the reading part, the control part 100 controls the developing unit U1 to execute the following development process.

[Developing Method]

Figure 7A:
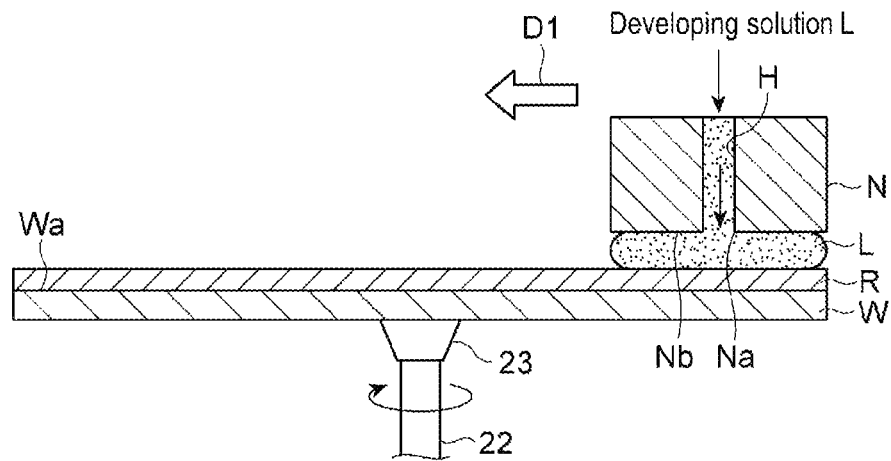
FIGS. 7A to 7C are views showing a state where the developing solution is widely spread onto the resist film by the wetted part.
Figure 7B:
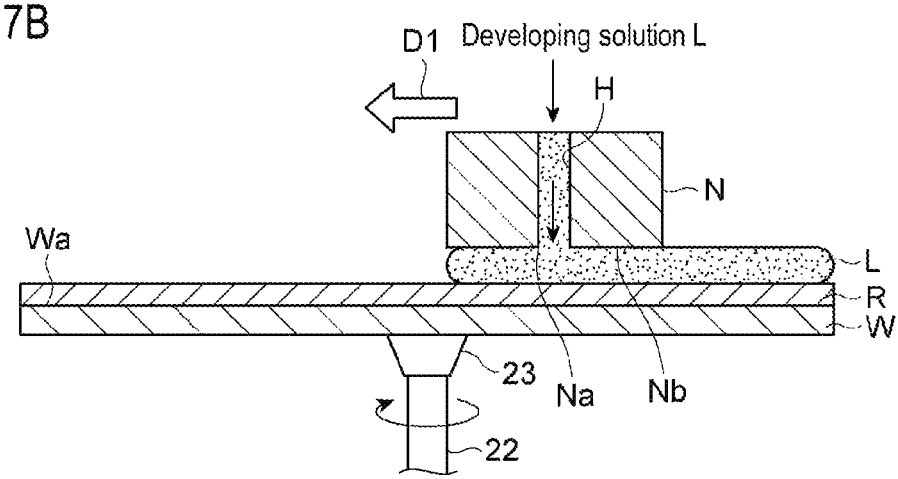

A description will be made as to a method of developing the resist film R after the exposure process using the developing unit U1. First, the wafer W having the resist film R formed thereon and exposed by the exposure apparatus 3 is held by the rotating/holding part 20. Next, as shown in FIG. 7A, the control part 100 controls the slide block 32 and the arm 33 such that the bottom surface Nb of the wetted part N faces a peripheral portion of the surface Wa of the wafer W. Thus, the wetted part N is positioned above the surface Wa of the wafer W. Subsequently, as shown in FIGS. 7A and 7B, the control part 100 controls the pump 43 and the valve 44 to supply the developing solution L through the discharge hole Na into a gap G (see FIG. 6) defined between the surface of the resist film R and the bottom surface Nb, while controlling the rotating part 21 to rotate the wafer W. Simultaneously, the control part 100 controls the slide block 32 to move the wetted part N from the peripheral portion of the wafer W toward the central portion (rotation axis) of the wafer W (see an arrow D1 indicated in FIGS. 7A and 7B).

Figure 7C:
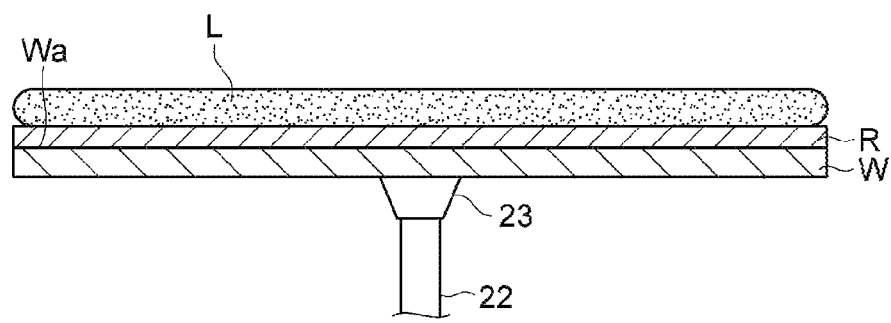

Once the wetted part N reaches the rotation axis of the wafer W, the control part 100 controls the pump 43 and the valve 44 to stop the discharge of the developing solution L from the discharge hole Na. As a result, as shown in FIG. 7C, the developing solution L is widely spread on the entire surface of the resist film R, and subsequently, the resist film R is subjected to the developing process. A size of the gap G (a distance between the surface of the resist film R and the bottom surface Nb) may range from about 0.1 to 2.0 mm, and in some embodiments, may be about 1.0 mm.

At this time, a rotational speed of the wafer W may range from 5 to 100 revolutions/minute. In some embodiments, the rotational speed of the wafer W may range from 10 to 50 revolutions/minute. Alternatively, the rotational speed of the wafer W may range from 20 to 40 revolutions/minute. When the rotational speed of the wafer W is set to be 5 revolutions/minute or greater, the developing solution L may be sufficiently widely spread on the resist film R in a short period of time. Further, when the rotational speed of the wafer W is set to be 100 revolutions/minute or less, the developing solution L supplied from the wetted part N may be sufficiently restrained from flowing to the peripheral portion of the wafer W on the surface of the resist film R by virtue of a centrifugal force. This makes it possible to more accurately control a speed at which the developing solution L is widely spread on the resist film R.

Figure 8A:
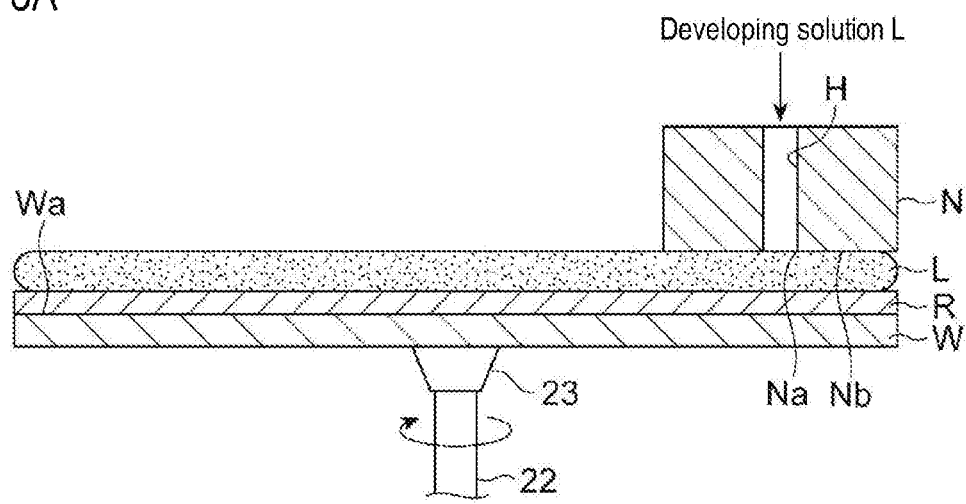
FIGS. 8A and 8B are views showing a state where the developing solution is held by the wetted part.

Subsequently, as shown in FIG. 8A, in a state where the bottom surface Nb of the wetted part N and the surface Wa of the wafer W face each other, the control part 100 controls the slide block 32 to move the wetted part N to the peripheral portion of the wafer W. Thereafter, the control part 100 controls the wetted part N to stay above the peripheral portion of the wafer W while rotating the wafer W. At this time, the rotational speed of the wafer W may be the same as that applied when supplying the developing solution L.

Figure 8B:
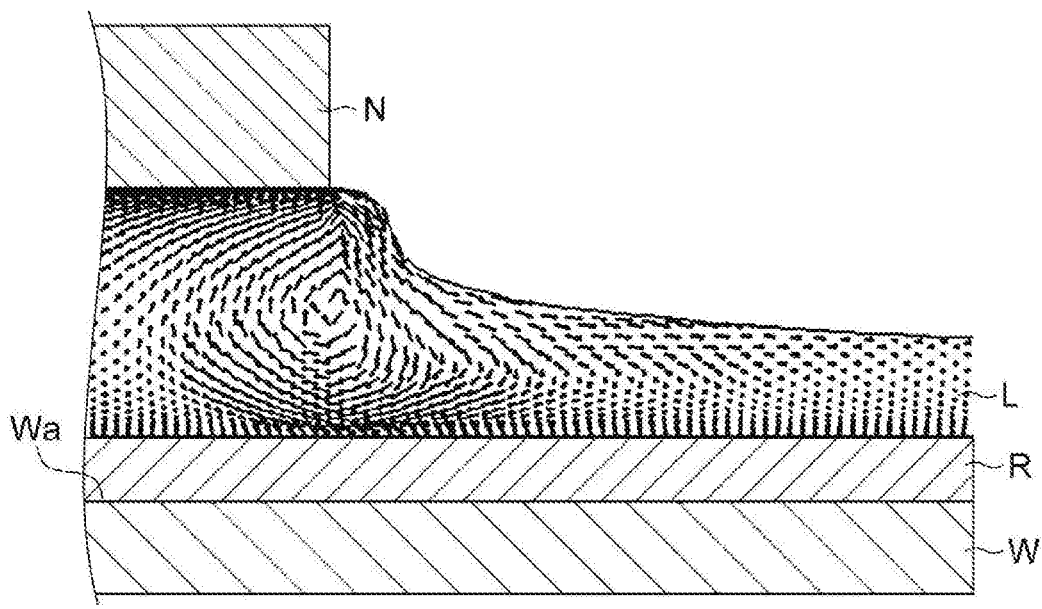

Here, as shown in FIG. 8B, in the vicinity of the periphery of the wetted part N, an eddy tending to return inward of the wetted part N, rather than a flow tending to widen outward of the wetted part N, is significantly generated. Thus, most of the developing solution L positioned between the bottom surface Nb of the wetted part N and the surface of the resist film R is held in-situ without flowing outward of the wetted part N. In particular, in this embodiment, since the rotation number of the wafer W is relatively small as mentioned above, it will be difficult for the developing solution L to move outward of the wetted part N. Therefore, when the wetted part N stays above the peripheral portion of the wafer W, the developing solution L is held between the bottom surface Nb of the wetted part N and the resist film R as shown in FIGS. 8A and 8B. In some embodiments, the holding time (a time during which the wetted part N reaches the peripheral portion of the wafer W and stays above the peripheral portion) may lay within, e.g., a range from 10 to 20 seconds.

Subsequently, after a predetermined period of development time (a period of time which has lapsed after the discharge of the developing solution L is stopped) elapses, the control part 100 controls the slide block 32 and the arm 33 to withdraw the wetted part N from above the surface Wa of the wafer W. For example, the development time may fall within a range from 10 to 60 seconds. Thereafter, the surface Wa of the wafer W is washed away with a cleaning solution, followed by being dried to form a predetermined resist pattern on the surface Wa of the wafer W. In this way, the development process is completed.

[Relationship Between Concentration of Development Residue and Line Width]

Once the developing solution L is supplied to the resist film R (resist material), the resist film R starts to dissolve in the developing solution L so that a dissolution product (development residue) generated from the resist film R is spread as ions in the developing solution L. Thus, as the dissolution of the resist film R in the developing solution L progresses, a concentration of the development residue in the developing solution L is increased. The present inventors have examined a relationship between this concentration and a line width and have found that the line width is positively correlated with the concentration. Hereinafter, such an examination method will be described in detail.

Figure 9A:
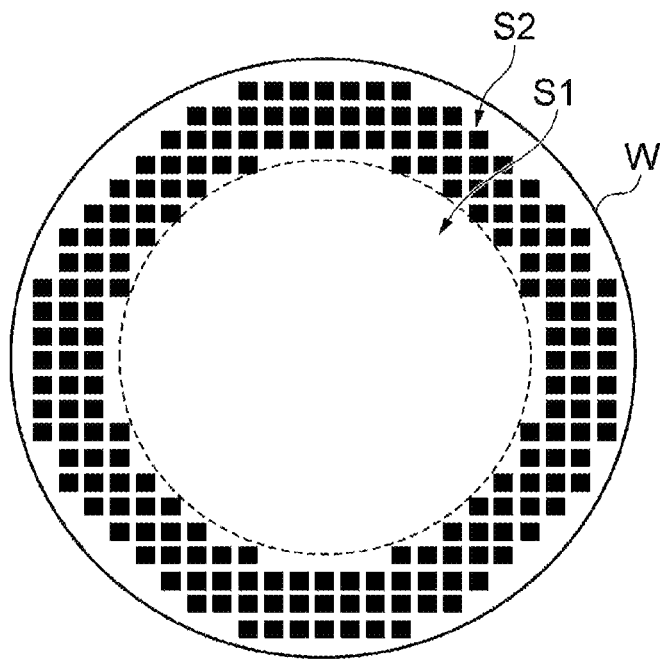
FIG. 9A is a view showing a wafer used to check an influence of a development residue on a line width of a resist pattern.

First, five wafers W each of which having the resist film R formed on the surface Wa thereof using the negative photoresist were prepared as test samples 1 to 5. As shown in FIG. 9A, the surface Wa of the wafer W is defined in two regions, e.g., a central region S1 and an outer region S2.

In the resist film R included in the region S1 of a circular shape, areas to be exposed were arbitrarily adjusted according to test samples 1 to 5. Meanwhile, in the resist film R included in the region S2 of a circular ring shape, the entire region thereof was exposed at an uniform exposure amount through the use of a mask (reticle) having a predetermined opening pattern. In the predetermined opening pattern, a pattern interval was about 45 nm, regardless of test samples.

Subsequently, the developing solution L was supplied to the entire region (the entire region of the surface of the resist film R) of the surface Wa of the wafer W to perform the development process. After the development process, the surface Wa of the wafer W was washed away with a cleaning solution, and then dried. Thereafter, a line width of each of test samples 1 to 5 was measured.

Next, an exposure area in the region S1 of each of test samples 1 to 5 will be described in detail. In test sample 1, the entire region S1 was exposed. As such, in a subsequent development process, the resist film R included in the region S1 hardly dissolved, and thus, a development residue was not generated in the region S1. Accordingly, an amount of a development residue present in the region S2 is mainly derived from the resist film R dissolved in the region S2.

In test sample 2, 75% of the area of the region S1 was exposed and the remaining area was not exposed. Thus, in the subsequent development process, the resist film R included in the region S1 was slightly dissolved and at least a portion of a development residue generated in the region S1 moved to the region S2. Accordingly, an amount of a development residue present in the region S2 was derived from an amount of the resist film R dissolved in both the regions S1 and S2.

In test sample 3, 50% of the area of the region S1 was exposed and the remaining area was not exposed. Thus, in the subsequent development process, the resist film R included in the region S1 was dissolved and at least a portion of a development residue generated in the region S1 moved to the region S2. Accordingly, an amount of a development residue present in the region S2 was derived from an amount of the resist film R dissolved in both the regions S1 and S2.

In test sample 4, 25% of the area of the region S1 was exposed and the remaining area was not exposed. Thus, in the subsequent development process, a significant amount of the resist film R included in the region S1 was dissolved and at least a portion of a development residue generated in the region S1 moved to the region S2. Accordingly, an amount of a development residue present in the region S2 was derived from an amount of the resist film R dissolved in both the regions S1 and S2.

In test sample 5, the entire region S1 was not exposed. Thus, in the subsequent development process, the resist film R of the region S1 was almost dissolved and at least a portion of a development residue generated in the region S1 moved to the region S2. Accordingly, an amount of a development residue present in the region S2 was derived from an amount of the resist film R dissolved in both the regions S1 and S2. As seen from the above, a concentration of the development residue in the region S2 (an amount of the development residue included in the developing solution L in the region S2) was the lowest in test sample 1 and increased in order of test samples 2 to 5.

Figure 9B:
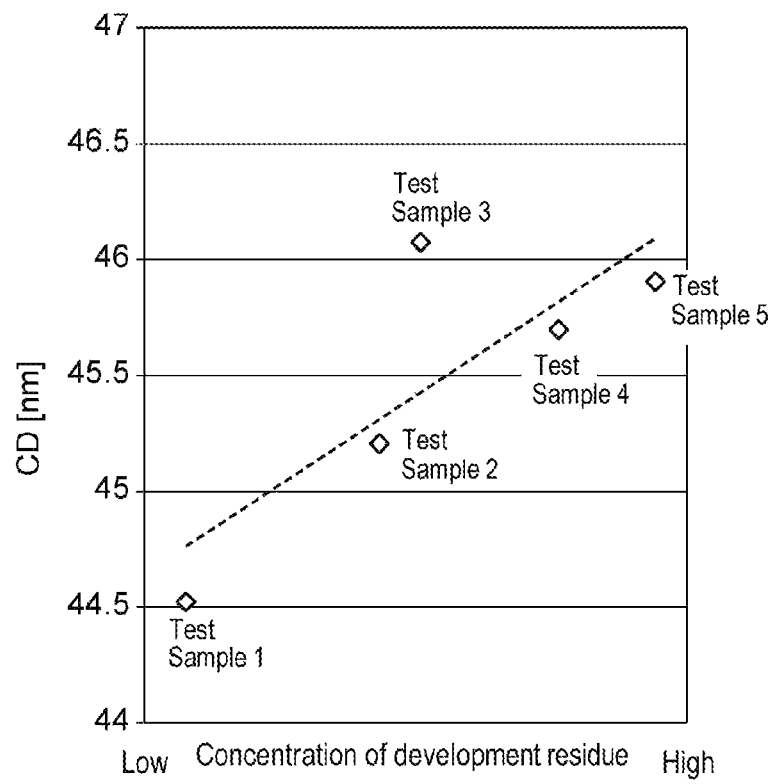
FIG. 9B is a graph showing a line width of a resist pattern with respect to a concentration of a development residue.

FIG. 9B shows measurement results of the line widths of test samples 1 to 5. As shown in FIG. 9B, it was confirmed that the line width of the resist pattern was positively correlated with the concentration of the development residue. That is to say, it was recognized that the development speed is slow and the line width increases with an increase in concentration of the development residue. In FIG. 9B, a linear dotted line represents a primary approximate line (regression line) regarding each point.

[Operation]

In general, in a region (preceding region) to which the developing solution L is supplied in a relatively early stage, a period of time for which the developing solution L is brought into contact with the resist film R is prolonged. Thus, the preceding region preferentially undergoes the development. This accelerates the dissolution of the resist film R in the developing solution L, thereby tending to decrease a line width. Meanwhile, in a region (following region) to which the developing solution is supplied in a relatively late stage, the development is delayed. Thus, the dissolution of the resist film R in the developing solution L does not progress, thereby tending to increase a line width. Therefore, in order to obtain a uniform in-plane line width distribution, it is required to delay the progress of the development with respect to the preceding region in the surface Wa of the wafer W so as to adjust the line width. Accordingly, in this embodiment, the wetted part N having the bottom surface Nb that faces the surface Wa of the wafer W is positioned above the preceding region (the peripheral portion of the wafer W in this embodiment) in the surface Wa of the wafer W to which the developing solution L is supplied from the discharge hole Na of the wetted part N such that the developing solution L is held between the bottom surface Nb and the surface of the resist film R. Thus, when the developing solution L is held in the preceding region (the peripheral portion of the wafer W) by the presence of the wetted part N, a concentration of the development residue included in the developing solution L is increased between the bottom surface Nb and the surface of the resist film R. Accordingly, the dissolution of the resist film R in the preceding region (the peripheral portion of the wafer W) is suppressed so that the progress of development is suppressed. As a result, the use of the wetted part N controls the line width in the preceding region (the peripheral portion of the wafer W) to be approximately equal to the line width of the following region (the central portion of the wafer W). As seen from the above, it is possible to enhance uniformity of the in-plane line width distribution. In particular, based on the aforementioned recognition that the line width is positively correlated with the concentration of the development residue, the wetted part N may be positioned above the preceding region to adjust the concentration of the development residue in the preceding region, thus realizing a desired line width.

In this embodiment, the wetted part N is moved from the peripheral portion of the wafer W toward the rotation axis of the wafer W such that the developing solution L is widely spread on the entire surface of the resist film R. With this configuration, it is easy for the development residue generated in the peripheral portion of the wafer W to move toward the central portion (i.e., the rotation axis) of the wafer W along with the developing solution L supplied from the discharge hole Na, with the movement of the wetted part N. This makes it difficult to discharge the development residue used in controlling the line width outward of the wafer W. Accordingly, it is possible to effectively utilize the development residue generated on the surface Wa of the wafer W for the control of the line width.

In this embodiment, the discharge hole Na is formed in the bottom surface Nb of the wetted part N. Thus, the developing solution L is supplied by the wetted part N. This reduces the number of components, thus reducing cost.

OTHER EMBODIMENTS

While the embodiment of the present disclosure has been described in detail above, the present disclosure is not limited thereto. While in the above embodiments, the wetted part N has been described to be positioned above the peripheral portion of the wafer W such that the developing solution L is held between the bottom surface Nb of the wetted part N and the surface of the resist film R, the present disclosure is not limited thereto. In some embodiments, the wetted part N may be positioned above a region other than the peripheral portion of the wafer W as long as the region is a preceding region to which the developing solution L is supplied from the wetted part N in a relatively early stage, in the surface Wa of the wafer W.

Figure 10A:
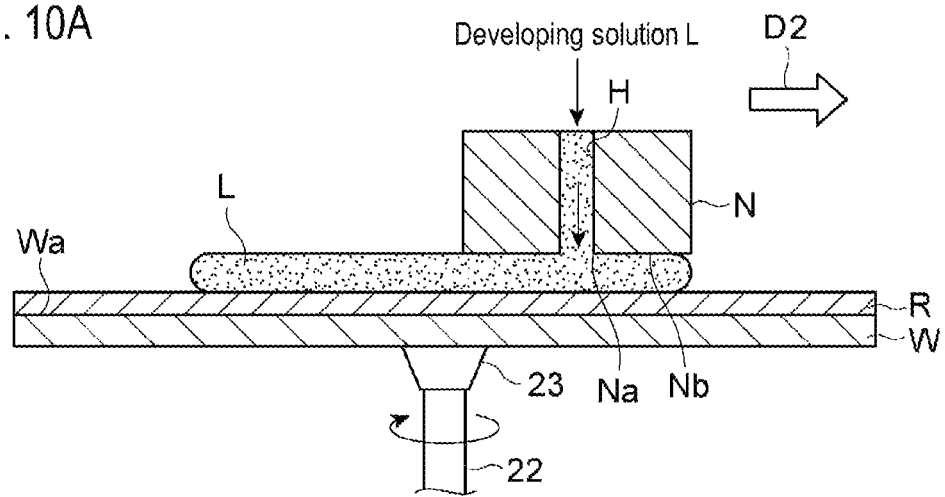
FIGS. 10A to 10C are views showing a state where a developing solution is widely spread onto a resist film by a wetted part in another example.
Figure 10B:
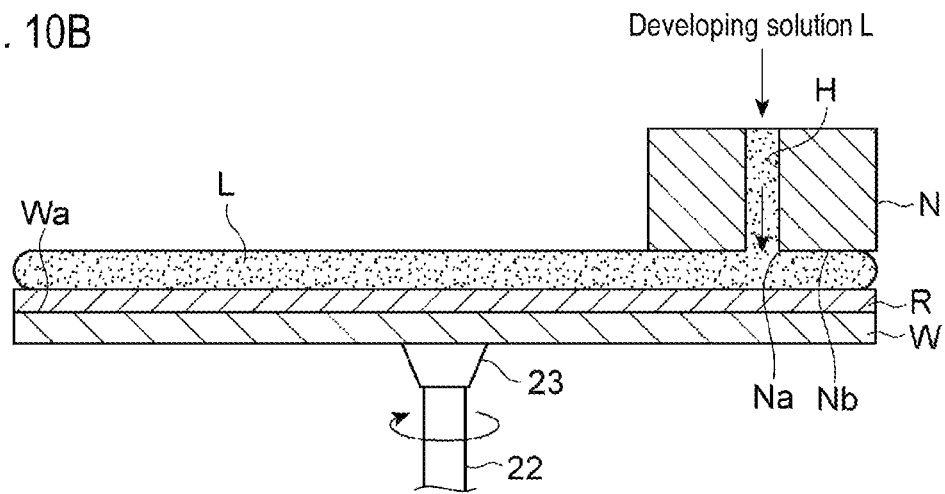
Figure 10C:
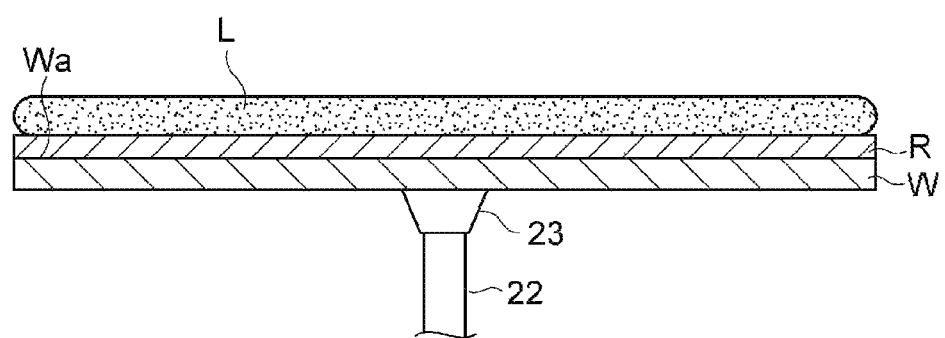

In some embodiments, the control part 100 may control the slide block 32 to move the wetted part N from the central portion (rotation axis) of the wafer W toward the peripheral portion such that the developing solution L is widely spread on the entire surface of the resist film R. Specifically, first, as shown in FIG. 10A, the control part 100 controls the slide block 32 and the arm 33 to position the wetted part N above the surface Wa of the wafer W such that the bottom surface Nb of the wetted part N faces the central portion (rotation axis) of the surface Wa of the wafer W. Subsequently, as shown in FIGS. 10A and 10B, the control part 100 controls the rotating part 21 to rotate the wafer W, and simultaneously controls the pump 43 and the valve 44 to supply the developing solution L from the discharge hole Na to the gap G (see FIG. 6) defined between the surface of the resist film R and the bottom surface Nb of the wetted part. Simultaneously, the control part 100 controls the slide block 32 to move the wetted part N from the central portion (rotation axis) of the wafer W toward the peripheral portion (see the arrow D2 indicated in FIG. 10A). Thereafter, once the wetted part N reaches the peripheral portion of the wafer W, the control part 100 controls the pump 43 and the valve 44 to stop the discharge of the developing solution L from the discharge hole Na. In this way, as shown in FIG. 10C, the developing solution L is widely spread on the entire surface of the resist film R, and the development of the resist film R progresses. In this case, the developing solution L is preferentially supplied onto the central portion of the wafer W. As such, the wetted part N is positioned above the central portion of the wafer W such that the developing solution L is held between the bottom surface Nb of the wetted part N and the surface of the resist film R.

Figure 11:
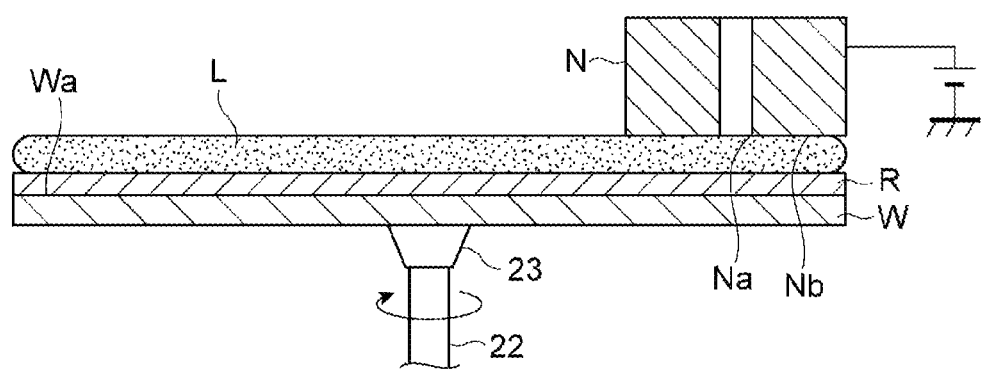
FIG. 11 is a view showing a state where a developing solution is held by a wetted part in another example.

In some embodiments, in the case where the developing solution L is held between the bottom surface Nb of the wetted part N and the surface of the resist film R, a positive electric potential may be applied to the wetted part N as shown in FIG. 11. The development residue is known to be charged negatively. Thus, the application of the positive electric potential to the wetted part N facilities holding the development residue in the vicinity of the wetted part N.

A certain wetted part may be used as the wetted part N as long as it has the bottom surface Nb that faces the surface of the resist film R (i.e., the surface Wa of the wafer W). Thus, the shape of the wetted part N is not particularly limited. As an example, a columnar shape or a plate shape may be employed as the shape of the wetted part N.

Examples of the bottom surface Nb may include a surface having a two-dimensionally or three-dimensionally curved shape or an irregular surface, in addition to the plate shape. In some embodiments, the bottom surface Nb may be subjected to a roughening process. Even in these cases, a surface area of the bottom surface Nb is increased so that a flux of the developing solution L is hampered. This facilities holding the developing solution L between the bottom surface Nb and the surface of the resist film R.

Figure 12A:
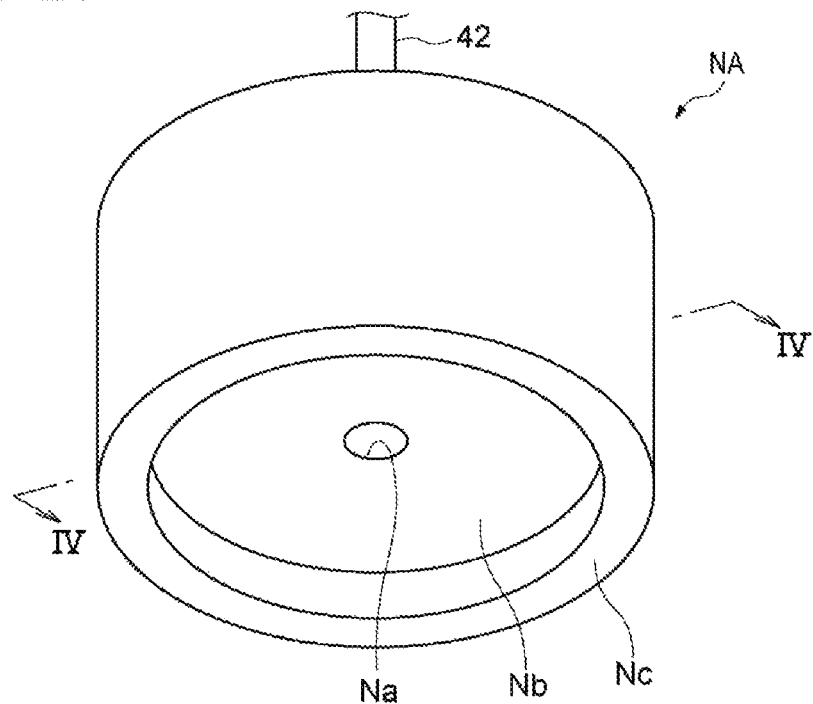
FIG. 12A is a view showing a wetted part when obliquely viewed from the bottom, in another example.
Figure 12B:
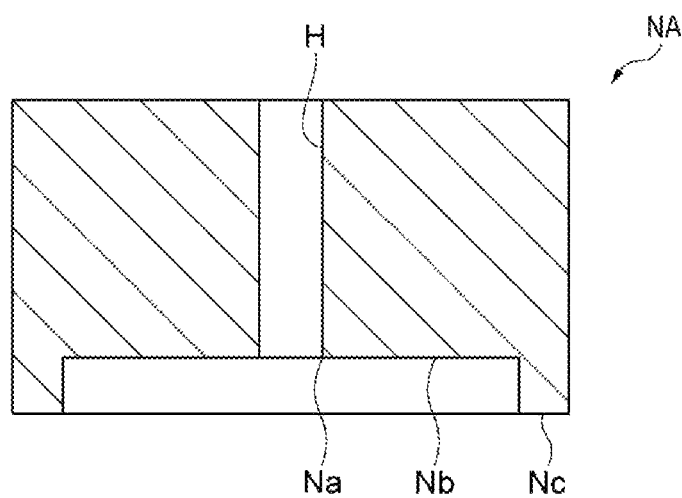
FIG. 12B is a cross-sectional view taken along line IV-IV of FIG. 12A.

FIG. 12 shows a wetted part NA according to another example. As shown in FIG. 12, the wetted part NA includes a bottom surface Nb on which a protrusion portion Nc is formed. The protrusion portion Nc extends along a periphery of the wetted part NA (bottom surface Nb) to have an annular shape. The protrusion portion Nc prevents the developing solution L from flowing from the center of the wetted part NA toward the periphery. This facilities holding the developing solution L between the bottom surface Nb of the wetted part NA and the surface of the resist film.

Figure 13A:
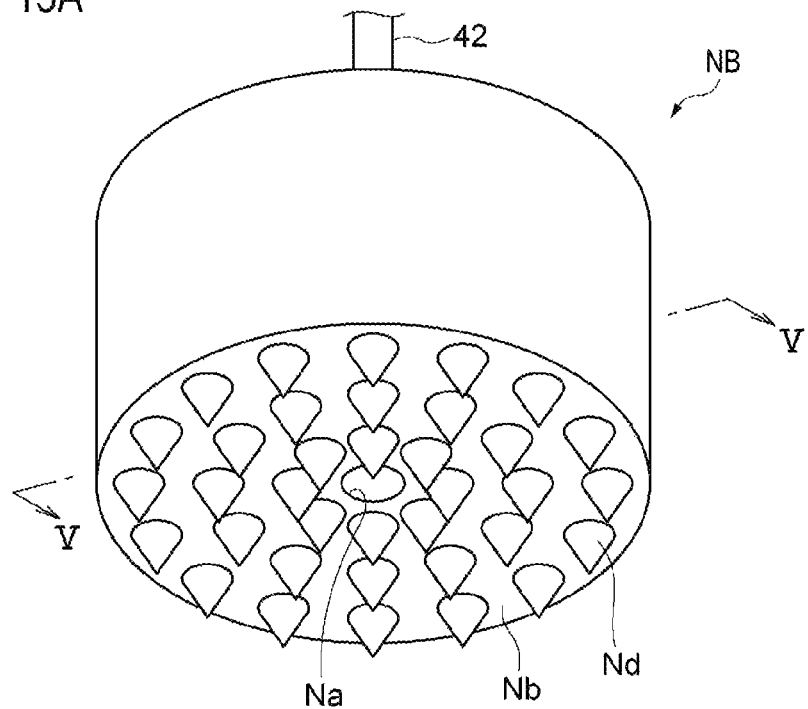
FIG. 13A is a view showing a wetted part when obliquely viewed from the bottom, in another example.
Figure 13B:
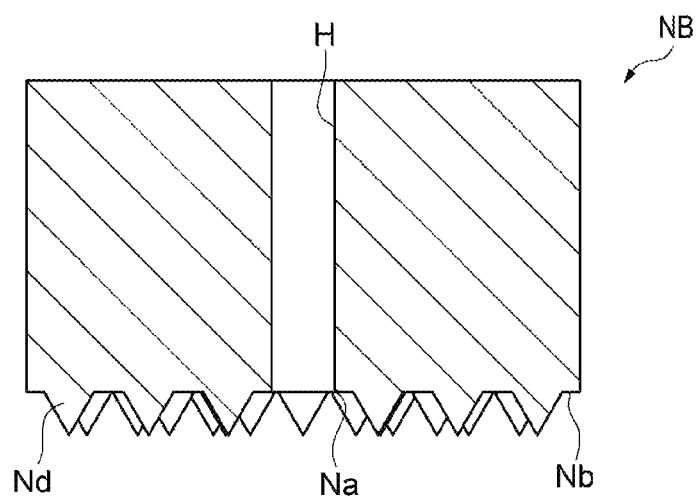
FIG. 13B is a cross-sectional view taken along line V-V of FIG. 13A.

FIG. 13 shows a wetted part NB according to still another example. As shown in FIG. 13, a plurality of protrusions Nd is formed on a bottom surface Nb of the wetted part NB. The plurality of protrusions Nd prevents the developing solution L from flowing. This facilities holding the developing solution L between the bottom surface Nb of the wetted part NB and the surface of the resist film. While in FIG. 13, each of the protrusions Nd has been shown to have a triangular pyramid shape, the present disclosure is not limited thereto. As an example, the protrusions Nd may have a polygonal pyramid shape, a polygonal columnar shape, or any other shape as long as they provide a sufficient contact area between the wetted part NB and the developing solution L to hamper a flow of the developing solution L.

Figure 14:
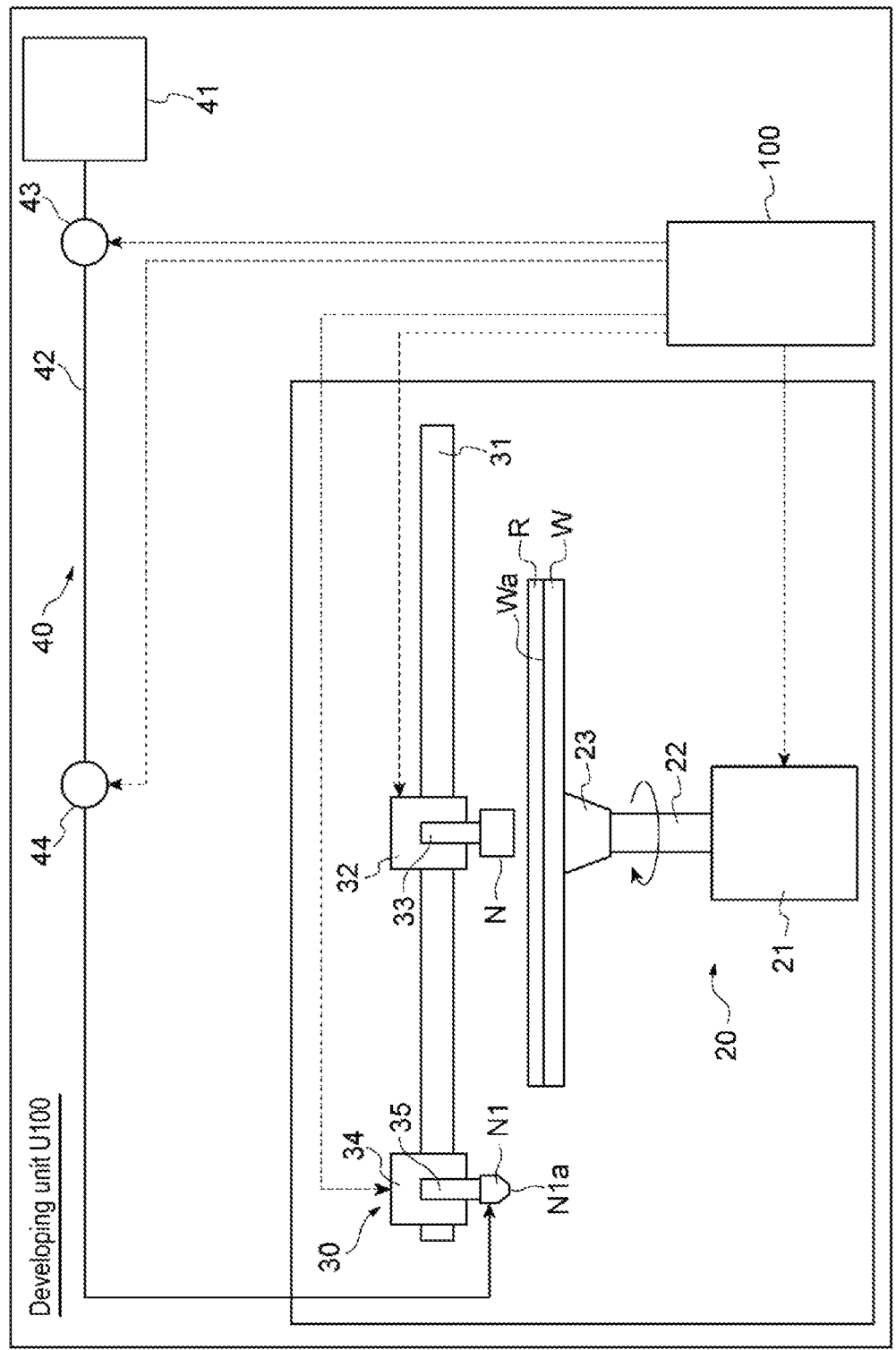
FIG. 14 is a schematic view showing a developing unit in another example.

While in the above embodiments, the wetted part N has been described to include the discharge hole Na formed in the bottom surface Nb thereof and has been described to serve as the discharge nozzle of the developing solution L, the present disclosure is not limited thereto. In some embodiments, as shown in FIG. 14, the developing solution supply part 40 may include a discharge nozzle N1 independently of the wetted part N, wherein the through hole H and the discharge hole Na are not formed in the wetted part N. In this case, as shown in FIG. 14, the driving part 30 further includes a slide block 34 and an arm 35. The slide block 34 is connected to the guide rail 31 such that the slide block 34 is movable along the guide rail 31 in the horizontal direction. The arm 35 is connected to the slide block 34 such that the arm 35 is movable in the vertical direction. The discharge nozzle N1 is connected to a lower end of the arm 35. The discharge nozzle N1 is coupled to the developing solution storage part 41 through the supply pipe 42. A discharge hole N1a is formed in a lower end of the discharge nozzle N1. The developing solution L supplied from the developing solution storage part 41 is discharged through the discharge hole N1a.

Figure 15A:
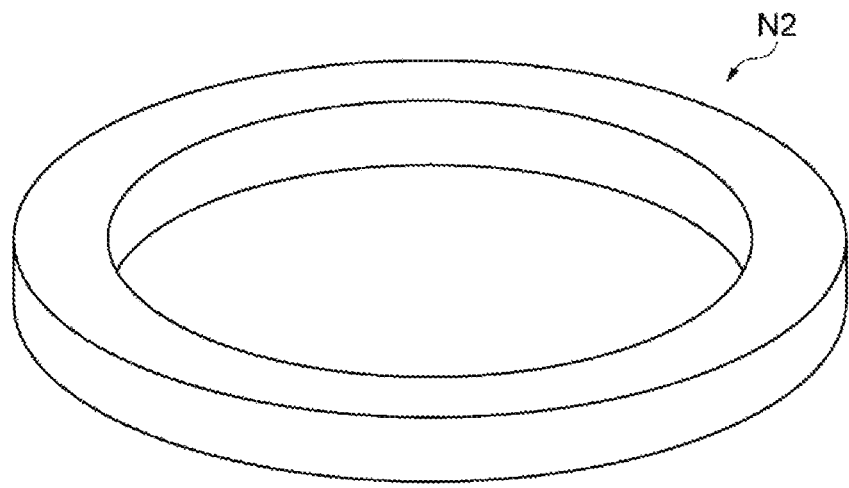
FIG. 15A is a view of a wetted part when obliquely viewed from the top, in another example.
Figure 15B:
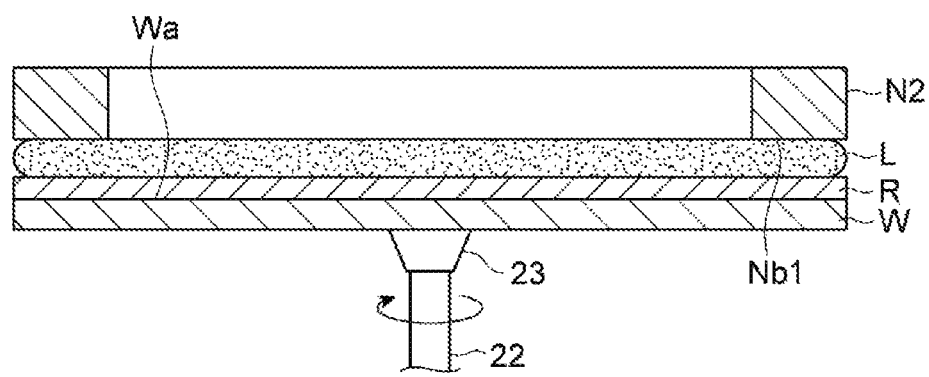
FIG. 15B is a view showing a state where a developing solution is held by the wetted part of FIG. 15A.

In a developing unit U100 shown in FIG. 14, in a case where the developing solution L is supplied from the peripheral portion to the central portion on the surface Wa of the wafer W, a wetted part N2 as shown in FIG. 15A may be used instead of the wetted part N having a simple columnar shape or a plate shape without the through hole H and the discharge hole Na. The wetted part N2 has a circular ring shape which is obtained by cutting out a central portion of a circular plate in a circular shape. The wetted part N2 includes a bottom surface Nb1 formed in a direction that intersects with the central axis thereof. As shown in FIG. 15B, the bottom surface Nb1 faces the peripheral portion of the surface Wa of the wafer W in a substantially parallel relationship. Even in this case, the dissolution of the resist film R is restrained in the preceding region (the peripheral portion of the wafer W) so that the progress of the development is restrained. This enhances uniformity of an in-plane line width distribution. In some embodiments, the wafer W may be rotated or may not be rotated while the wetted part N2 is being positioned above the surface Wa of the wafer W.

In some embodiments, the wetted part N or the discharge nozzle N1 may be moved above a sequence of regions (to which the developing solution L is sequentially supplied from the wetted part N or the discharge nozzle N1) in the surface Wa of the wafer W such that the developing solution L is held between the bottom surface Nb of the wetted part N and the surface of the resist film R. In this case, the wetted part N or the discharge nozzle N1 is moved in order, starting from a region where the resist film R is easy to dissolve. This makes it possible to equally control sizes of line widths on the entire surface Wa of the wafer W. Thus, it is possible to further enhance uniformity of the in-plane line width distribution.

In some embodiments, the resist film R may be formed using a negative photoresist or a positive photoresist.

EXAMPLES

The following tests were performed to confirm that uniformity of in-plane line width distribution can be improved by performing a development process using a developing unit including the same configuration as that of the developing unit U1 according to the above embodiment.

Test Example 1

A wafer having a diameter of 300 mm and a negative photoresist were prepared. A resist film having a thickness of 0.1 μm was formed on a surface of the wafer using the negative photoresist. Subsequently, the resist film was exposed by an exposure apparatus using a mask (reticle) having openings formed in a predetermined pattern. Thereafter, while rotating the wafer, a wetted part was moved from a peripheral portion of the wafer toward a central portion (rotation axis) thereof, while supplying a developing solution through a discharge hole of the wetted part into the gap G (see FIG. 6). The gap G is defined between a surface of the resist film and a bottom surface (having a diameter of 20 mm) of the wetted part. At this time, the number of revolutions of the wafer was set to 30 revolutions/minute, a movement speed of the wetted part was set to 20 mm/sec, and a flow rate of the developing solution discharged from the discharge hole was set to 1 cc/sec. A period of movement time for which the wetted part is moved from the peripheral portion to the central portion of the wafer was 7.5 seconds.

After the wetted part reached the rotation axis of the wafer, the discharge of the developing solution from the discharge hole was stopped. Subsequently, the wetted part was moved from the central portion of the wafer to the peripheral portion. A period of time spent in moving the wetted part from the central portion of the wafer to the peripheral portion was about 1 second. Thereafter, while rotating the wafer, the wetted part was held above the peripheral portion of the wafer for about 5 seconds. At this time, the number of revolutions of the wafer was set to 30 revolutions/minute. In test example 1, a central position of the wetted part was spaced from the center of the wafer W by a distance of 130 mm That is to say, the central position of the wetted part in test example 1 was a region of the surface of the wafer to which the developing solution is first supplied through the discharge hole of the wetted part.

Subsequently, when a time interval (development time) of 10 seconds has lapsed after the discharge of the developing solution is stopped, the wetted part was moved away from a location above the surface of the wafer. Thereafter, the surface of the wafer was washed away with a cleaning solution and was dried. In this manner, the development process was completed and a predetermined resist pattern was formed on the surface of the wafer. Thereafter, with respect to the formed resist pattern, measurement of a line width was performed depending on distances from the center of the wafer. A length-measuring SEM (manufactured by Hitachi High-Technologies Corporation) was used in measuring the line width. The measurement results are shown in FIG. 16. In test example 1, a difference between a maximum value and a minimum value of the line width was about 1.6 nm.

Test Example 2

A developing process in test example 2 was performed in the same manner as that in test sample 1, except that a stay position of the wetted part was spaced from the center of the wafer by a distance of 80 mm. Similarly, a line width was measured depending on distances from the center of the wafer. The measurement results are shown in FIG. 17. In test example 2, a difference between a maximum value and a minimum value of the line width was about 2.3 nm.

Test Example 3

A developing process in test example 3 was performed in the same manner as that in test sample 1, except that a stay position of the wetted part was spaced from the center of the wafer by a distance of 40 mm. Similarly, a line width was measured depending on distances from the center of the wafer. The measurement results are shown in FIG. 18. In test example 3, a difference between a maximum value and a minimum value of the line width was about 3.7 nm.

Test Example 4

A developing process in test example 4 was performed in the same manner as that in test sample 1, except that a stay position of the wetted part was spaced from the center of the wafer by a distance of 0 mm (i.e., directly above the wafer). Similarly, a line width was measured depending on distances from the center of the wafer. The measurement results are shown in FIG. 19. In test example 4, a difference between a maximum value and a minimum value of the line width was about 3.8 nm.

(Test Results)

As shown in FIG. 19, in test sample 4 where a stay position of the wetted part was the center of the wafer, the peripheral portion of the wafer to which the developing solution is preferentially supplied has a prolonged period of time for which the developing solution is brought into contact with the resist film. This shows that the peripheral portion of the wafer to which the developing solution is preferentially supplied tends to accelerate the rate of dissolving the resist film in the developing solution, thus decreasing the line width. Meanwhile, it was confirmed that the central portion of the wafer to which the developing solution is later supplied, has the tendency that the dissolution of the resist film in the developing solution did not progress, thus increasing the line width.

In this regard, as shown in FIGS. 16 to 18, test examples 1 to 3 have shown that the line width tends to increase in the stay position of the wetted part. In particular, as shown in FIG. 16, test example 1 in which the wetted part was held above the region of the surface of the wafer to which the developing solution is first supplied through the discharge hole of the wetted part, has shown that a distribution of line width was almost uniform from the central portion of the wafer to the peripheral portion thereof, thus significantly improving uniform of the in-plane line width distribution.

According to a developing method, a developing apparatus, and a computer-readable recording medium of the present disclosure, it is possible to enhance uniformity of an in-plane line width distribution.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. An apparatus for developing an exposed resist film formed on a surface of a substrate to form a resist pattern, the apparatus comprising:
    a rotating/holding part configured to rotate the substrate about a rotation axis that extends in a direction perpendicular to the surface of the substrate, while supporting the substrate horizontally;
    a discharge hole through which a developing solution is supplied onto the resist film;
    a wetted part having a facing surface that faces the surface of the substrate;
    a moving mechanism configured to move the wetted part; and
    a control part configured to:
    supply the developing solution onto the resist film by moving the wetted part from a preceding region in the surface of the substrate to another region of the surface of the substrate in a diameter direction of the substrate; and
    position the wetted part above the preceding region to which the developing solution is initially supplied and to which a line width of the resist pattern needs to be adjusted, in the surface of the substrate, and stop the wetted part above the preceding region for a predetermined period of time to hold the developing solution,
    wherein the control part is configured to apply a positive electric potential to the wetted part.

2. The apparatus of claim 1, wherein the wetted part has a columnar shape or a plate shape.

3. The apparatus of claim 1, wherein an annular protrusion that extends from the facing surface toward the surface of the substrate is formed in a peripheral portion of the wetted part.

4. The apparatus of claim 1, wherein the control part is configured to move the wetted part above a sequence of regions to which the developing solution is sequentially supplied through the discharge hole on the surface of the substrate.

5. An apparatus for developing an exposed resist film formed on a surface of a substrate to form a resist pattern, the apparatus comprising:
    a rotating/holding part configured to rotate the substrate about a rotation axis that extends in a direction perpendicular to the surface of the substrate, while supporting the substrate horizontally;
    a discharge hole through which a developing solution is supplied onto the resist film;
    a wetted part having a facing surface that faces the surface of the substrate;
    a moving mechanism configured to move the wetted part; and
    a control part configured to:
    supply the developing solution onto the resist film by moving the wetted part from a preceding region in the surface of the substrate to another region of the surface of the substrate in a diameter direction of the substrate; and
    position the wetted part above the preceding region to which the developing solution is initially supplied and to which a line width of the resist pattern needs to be adjusted, in the surface of the substrate, and stop the wetted part above the preceding region for a predetermined period of time to hold the developing solution,
    wherein a plurality of protrusions that extend from the facing surface toward the surface of the substrate is formed in the facing surface of the wetted part.

* * * * *